(12) United States Patent
Iguchi

(10) Patent No.: US 11,037,980 B2
(45) Date of Patent: Jun. 15, 2021

(54) IMAGE DISPLAY DEVICE

(71) Applicant: SHARP KABUSHIKI KAISHA, Sakai (JP)

(72) Inventor: Katsuji Iguchi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/534,871

(22) Filed: Aug. 7, 2019

(65) Prior Publication Data

US 2020/0052033 A1 Feb. 13, 2020

Related U.S. Application Data

(60) Provisional application No. 62/717,305, filed on Aug. 10, 2018.

(51) Int. Cl.
*G09G 3/32* (2016.01)
*H01L 27/15* (2006.01)
*H01L 27/12* (2006.01)

(52) U.S. Cl.
CPC ............ *H01L 27/156* (2013.01); *G09G 3/32* (2013.01); *H01L 27/1225* (2013.01); *H01L 27/1248* (2013.01)

(58) Field of Classification Search
None
See application file for complete search history.

(56) References Cited

U.S. PATENT DOCUMENTS

| | | | |
|---|---|---|---|
| 8,791,474 B1 | 7/2014 | Bibl et al. | |
| 2015/0318328 A1* | 11/2015 | Bibl | H01L 51/50 257/89 |
| 2017/0141155 A1 | 5/2017 | Hughes et al. | |
| 2018/0082622 A1* | 3/2018 | Bae | G09G 3/006 |

FOREIGN PATENT DOCUMENTS

WO 2015/193434 A2 12/2015

* cited by examiner

*Primary Examiner* — Brian M Butcher
(74) *Attorney, Agent, or Firm* — ScienBiziP, P.C.

(57) ABSTRACT

In a pixel, at least two sets of a pair of wiring lines, that is connected to a pair of electrodes of a micro-LED and is coupled to a pixel circuit, are disposed, the pixel circuit has a first LED drive circuit that supplies a current to the micro-LED and a second LED drive circuit that substitutes for the first LED drive circuit, and the pixel circuit also has a switching device that short-circuits the pair of wiring lines.

20 Claims, 16 Drawing Sheets

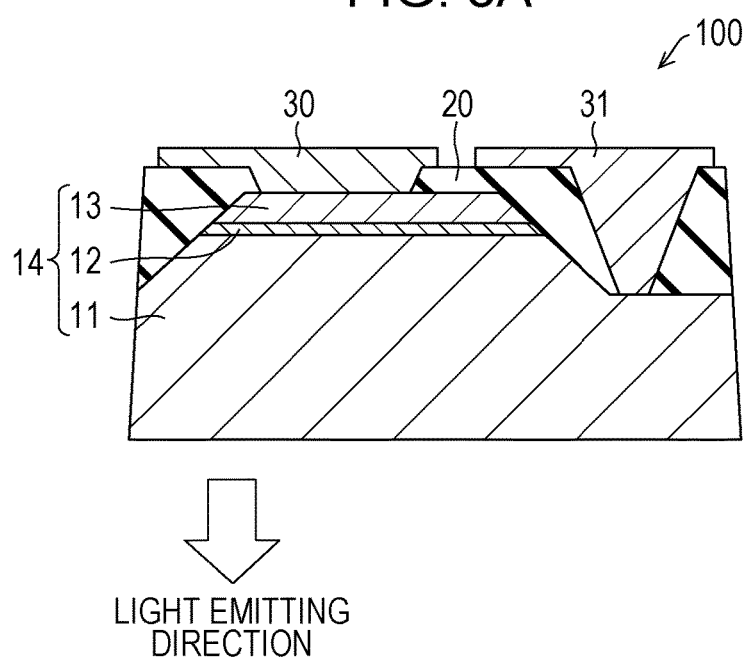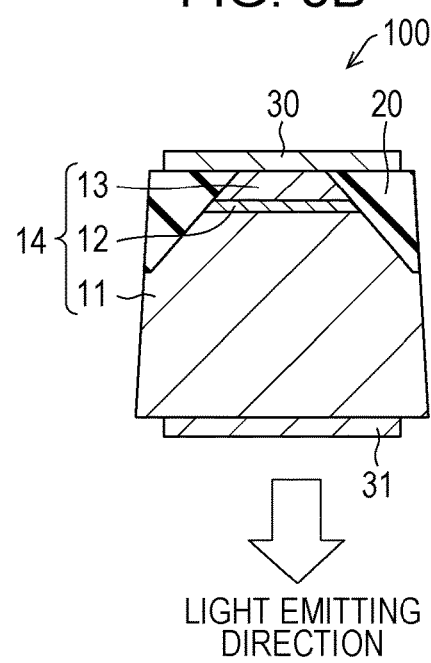

IMAGE DISPLAY DEVICE

BACKGROUND

1. Field

The present disclosure relates to an image display device and a manufacturing method thereof.

2. Description of the Related Art

In the related art, an image display device is known in which a plurality of micro-LEDs constituting pixels are provided on a backplane substrate. In such an image display device, micro-LEDs emitting light in respective colors of red (R), green (G) and blue (B) are disposed on a backplane substrate, which is configured with a thin film transistor (TFT), and color display is realized by driving these micro-LEDs with respective drive circuits, and by emitting light from these micro-LEDs.

In general, the backplane substrate configured with the thin film transistors uses polycrystalline silicon or oxide semiconductor such as IGZO (InGaZn oxide) formed on a glass substrate or a plastic substrate as an active layer. On the other hand, the micro-LED is a nitride semiconductor or an AlInGaP based compound semiconductor, and it is desirable to pick the micro-LED and dispose the micro-LED on the backplane substrate. A disposition method of the micro-LED is generally referred to as a pick & place method.

In the image display device, when the micro-LED is disposed on the backplane substrate by using the pick & place method, a pixel defect such as deficiency in micro-LED or no lighting of the disposed micro-LED may occur, thereby it is desirable to perform a defect countermeasure. For example, U.S. Pat. No. 8,791,474 discloses a method for performing a defect countermeasure by disposing a plurality of micro-LEDs. International Publication No. 2015/193434 discloses a method in which a drive circuit is also configured with a micro-chip, and a plurality of drive circuit microchips and micro-LEDs are disposed on the backplane substrate. U.S. Patent Application Publication No. 20170141155 discloses a flow of manufacturing processing of an image display device including a defect countermeasure.

In the so-called pick & place method, since it is desirable to separate individual micro-LEDs and dispose the separated micro-LEDs on a substrate, processing of disposing the micro-LED on the substrate takes a long time and deficiency in micro-LED tends to occur, thereby a processing yield has a great influence on the manufacturing cost. The technique disclosed in U.S. Pat. No. 8,791,474 or U.S. Patent Application Publication No. 20170141155 is effective because it can repair any pixel defects caused by the micro-LED, such as the deficiency in micro-LED or no lighting of the micro-LED.

However, when the pixel defect is caused by the pixel circuit instead of the micro-LED, since the pixel defect is found by the lighting test after the micro-LED is disposed, it is not possible to repair the pixel defect with the technique disclosed in U.S. Pat. No. 8,791,474 or U.S. Patent Application Publication No. 20170141155. Therefore, it is desirable to sort out the backplane substrate having defective pixels before disposing the micro-LED and dispose the micro-LED after repairing the sorted out backplane substrate, and it is also desirable to improve the yield. However, as described in International Publication No. 2015/193434, the method of disposing the plurality of drive circuit microchips and micro-LEDs on the backplane substrate causes an increase in material cost, which has a great influence on the manufacturing cost.

It is desirable to provide a technique in which a defective pixel on a backplane substrate can be repaired and a problematic micro-LED can be replaced.

SUMMARY

According to an aspect of the present disclosure, there is provided an image display device, including an array of pixels, each pixel has at least one micro-LED, a backplane substrate having an array of pixel circuits corresponding to the pixels, each pixel circuit including a set of signal lines, a power supply line and a ground line, a first LED drive circuit, a second LED drive circuit, a plurality of pairs of a first terminal and a second terminal, wiring lines which connect the first LED drive circuit with the first terminals, and a switching device which electrically connects the first terminals with the second terminals. Each of the micro-LEDs has a pair of electrodes that are connected with one of the pairs of the first terminal and the second terminal.

According to another aspect of the present disclosure, there is provided an image display device, including an array of pixels, each pixel has at least one micro-LED, a backplane substrate having an array of pixel circuits corresponding to the pixels, each pixel circuit including a set of signal lines, a power supply line and a ground line, a plurality of pairs of a first terminal and a second terminal, a micro-chip including a first LED drive circuit, a switching device which electrically connects the first terminals with the second terminals, and wiring lines which connect the micro-chip with the first terminals. The pixel circuit has a space where an extra micro-chip is disposable and the wiring lines extend to the space.

According to still another aspect of the present disclosure, there is provided an image display device, including an array of pixels, each pixel has at least one micro-LED, a backplane substrate having an array of pixel circuits corresponding to the pixels, each pixel circuit including a set of signal lines, a power supply line and a ground line, a first LED drive circuit, a plurality of pairs of a first terminal and a second terminal, wiring lines which connect the first LED drive circuit with the first terminals, and a switching device which electrically connects the first terminals with the second terminals. Each of the micro-LEDs has a pair of electrodes that are connected with one of the pairs of the first terminal and the second terminal and the switching device contains a thin film transistor disposed on the backplane substrate.

BRIEF DESCRIPTION OF THE DRAWINGS

FIGS. 3A and 3B are a sectional view of a micro-LED of Embodiment 1, FIG. 3A shows a sectional view of a single-sided electrode type micro-LED, and FIG. 3B shows a sectional view of an upper-and-lower electrode type micro-LED;

DESCRIPTION OF THE EMBODIMENTS

Embodiment 1

Hereinafter, Embodiment 1 of the present disclosure will be described in detail.
Overview of Image Display Device 200

Figure 1A:
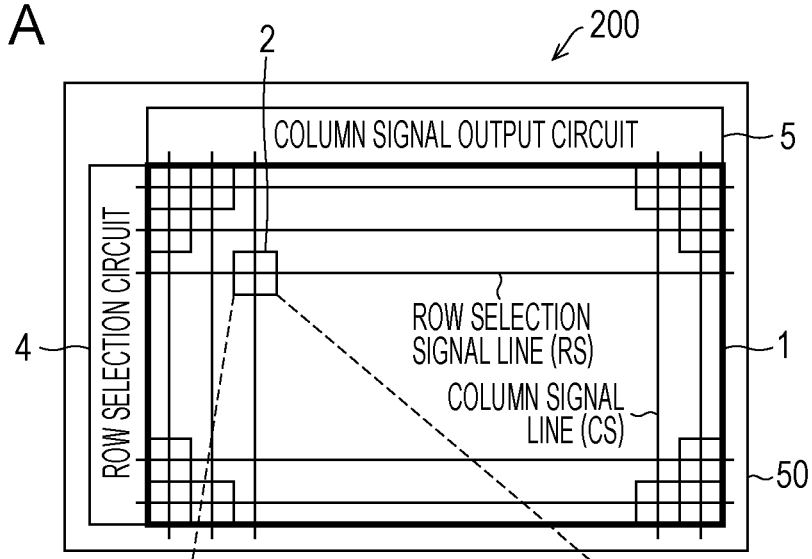
FIG. 1A is a view showing an entire configuration of an image display device according to Embodiment 1 of the present disclosure.
Figure 1B:
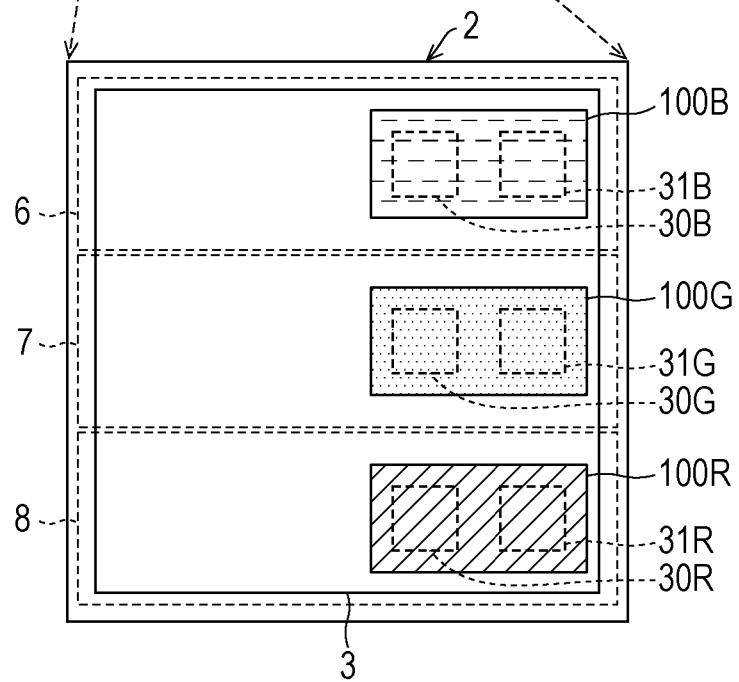
FIG. 1B is an enlarged view of a pixel.

FIG. 1A is a view showing an entire configuration of an image display device 200 according to the present embodiment, and FIG. 1B is a partial enlarged view showing a configuration of a pixel 2 in the image display device 200. The image display device 200 mounts a plurality of micro-LEDs 100 as light sources and drives each of the micro-LEDs 100 to realize display.

As shown in FIG. 1A, the image display device 200 includes a backplane substrate 50. The backplane substrate 50 is provided with a row selection circuit 4 and a column signal output circuit 5. Further, the backplane substrate 50 includes a pixel circuit 3 for each pixel 2.

As shown in FIG. 1A, the image display device 200 has a plurality of pixels 2, and the plurality of pixels 2 are arranged in a two-dimensional array form in a pixel region 1 of the image display device 200. It is assumed that the image display device 200 has a configuration in which three thousand or more micro-LEDs 100 are integrated into the pixel region 1. The size of the pixel region 1 is several inches to several tens of inches diagonally. Note that the pixel region 1 is not limited to a rectangle, and may be another shape such as a circle or an ellipse.

The backplane substrate 50 is a substrate for supplying a current to the micro-LED 100 to emit light, controlling the current supplied to each micro-LED 100 by the pixel circuit 3, and controlling a light emitting amount of each micro-LED 100. The backplane substrate 50 is provided with a plurality of pixel circuits 3 for supplying a current to the micro-LEDs 100. The image display device 200 is configured to dispose a plurality of pixels 2 including the micro-LEDs 100 on the backplane substrate 50. Note that the backplane substrate 50 may be provided with a wavelength conversion layer, a light diffusing layer, a color filter, and a micro-lens, or an optical member such as a reflector, on a light emitting side of the micro-LED 100.

The row selection circuit 4 selects a specific row disposed in the two-dimensional array form. The column signal output circuit 5 outputs a drive signal to the pixel circuit 3 of the row selected by the row selection circuit 4. The row selection circuit 4 and the column signal output circuit 5 may be formed of the thin film transistor (TFT), or may be configured to mount a driver chip, in which circuits are separately formed, on the substrate.

Each pixel 2 is provided with a plurality of micro-LEDs 100. When a plurality of one type micro-LEDs 100 (which emit the same color) are provided in the pixel 2, the image display device 200 displays a monochromatic image.

In the present embodiment, a case where the image display device 200 is a full color display device will be described below as an example. As shown in FIG. 1B, the pixel 2 is configured to include a plurality of subpixels 6, 7, and 8 that emit light of different wavelength bands. The subpixels are a blue subpixel 6, a green subpixel 7, and a red subpixel 8. In the blue subpixel 6, a blue light emitting micro-LED 100B is disposed. In the green subpixel 7, a green light emitting micro-LED 100G is disposed. In the red subpixel 8, a red light emitting micro-LED 100R is disposed. The blue light emitting micro-LED 100B emits blue light (for example, peak wavelength of 460 nm±15 nm). The green light emitting micro-LED 100G emits green light (for example, peak wavelength of 520 nm±15 nm). The red light emitting micro-LED 100R emits red light (for example, peak wavelength of 630 nm±15 nm). The pixel 2 can emit light of various colors by adjusting an intensity of each of the blue light emitting micro-LED 100B, the green light emitting micro-LED 100G, and the red light emitting micro-LED 100R.

Note that the blue light emitting micro-LED 100B, the green light emitting micro-LED 100G, and the red light emitting micro-LED 100R are collectively referred to as the micro-LED 100. When the micro-LED 100 is distinguished by a light emitting color thereof, each is also referred to as micro-LEDs 100R, 100G, and 100B. Similarly, for the other members, R, G, and B may be omitted when it is not desirable to distinguish the light emitting colors. A cross section along a substrate surface of the micro-LED 100 can have various planar shapes such as a rectangle, a polygon, a circle, and an ellipse. Moreover, in the present embodiment, it is assumed that the micro-LED 100 has a configuration in which the maximum length in a direction along the substrate surface is 60 μm or less.

The subpixels are not limited to have the configuration including blue, green, and red, and may include white, yellow, or the like. Each pixel 2 may include two types of subpixels, and the image display device 200 may perform two-color display.

Figure 2:
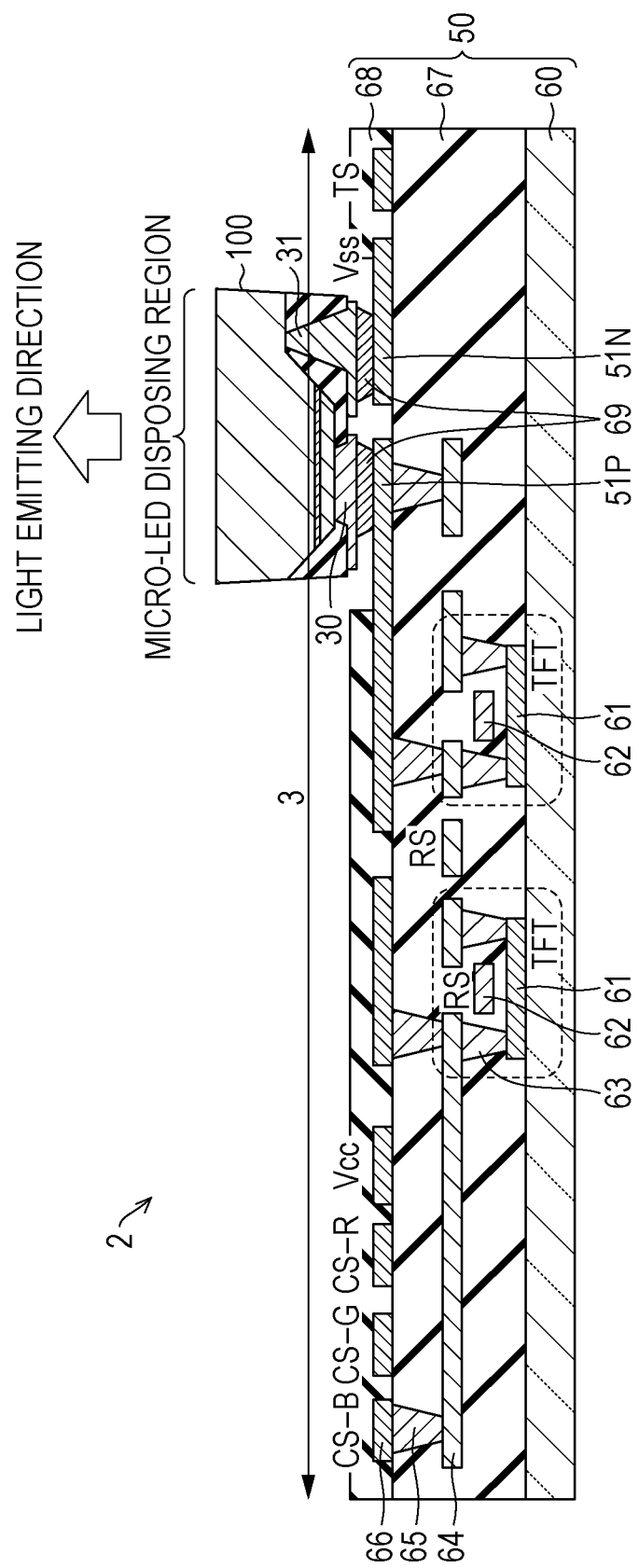
FIG. 2 is a pixel portion sectional view of the image display device of Embodiment 1.

FIG. 2 is a sectional view of a part (II-II in FIG. 6) of the pixel 2 of the image display device 200. The micro-LED 100 is electrically connected to the pixel circuit 3 in a micro-LED disposing region on the pixel circuit 3. Further, a redundant micro-LED disposing region (omitted in FIGS. 1A and 1B) for disposing the redundant micro-LED in a case where the micro-LED disposed on the micro-LED disposing region is defective is also provided on the pixel circuit 3. As shown in FIG. 2, the pixel circuit 3 is configured with a thin film transistor TFT formed on a substrate 60 made of an insulating material such as glass and plastic, or a member such as a metal material coated with an insulation film. The thin film transistor TFT constituting the pixel circuit 3 is configured such that a semiconductor layer 61 is disposed on the substrate 60, and a gate electrode layer 62 is disposed on the semiconductor layer 61 with a gate insulation film interposed therebetween. The semiconductor layer 61 is polycrystalline silicon or an oxide semiconductor such as IGZO (InGaZn oxide).

Wiring lines are formed in the backplane substrate 50 by a first interconnection layer 64, a second interconnection layer 66, a contact portion 63 connecting the semiconductor layer 61, the gate electrode layer 62, and the first interconnection layer 64 with one another, a via portion 65 connecting the first interconnection layer 64 to the second interconnection layer 66, and the like. These wiring lines are insulated by an interlayer insulation film 67.

In the example shown in FIG. 2, although the number of wiring layers of the backplane substrate 50 is two layers, it is not limited to this, and the number of wiring layers may be three or more. The second interconnection layer 66, which is the uppermost interconnection layer, is covered with a protection film 68 that is an insulation layer, and the protection film 68 is opened at the micro-LED disposing region which is a connection place with the micro-LED 100. In the micro-LED disposing region of the pixel circuit 3, a P-electrode 30 and an N-electrode 31 of the micro-LED 100 are connected to a first terminal 51P and a second terminal 51N, which are configured with the uppermost interconnection layer, respectively, with connection materials 69 interposed therebetween.

Note that the protection film 68 covering the uppermost interconnection layer can be omitted. On the other hand, in order to avoid an occurrence of defect such as wiring short due to a dust adhesion in test processing or repairing processing of the backplane substrate 50, or in disposing processing, light emitting test processing, or repairing processing of the micro-LED 100, or the like, it is desirable that the uppermost interconnection layer be covered with the protection film 68. The protection film 68 may be an inorganic insulation film such as a silicon nitride film (SiN), or an organic insulation film such as a polyimide film.

FIGS. 3A and 3B are a sectional view of the micro-LED 100. The micro-LED 100 includes a compound semiconductor 14 as a light emitting body. The compound semiconductor 14 is configured to interpose a light emitting layer 12 between an N-side layer 11 (first conductive layer) and a P-side layer 13 (second conductive layer), and make laminate thereof. The compound semiconductor 14 is a nitride semiconductor (AlInGaN based) in a case of the blue light emitting micro-LED 100B and the green light emitting micro-LED 100G. In a case of the red light emitting micro-LED 100R, the compound semiconductor 14 is AlInGaP based, and may be AlGaAs based or GaAs based.

Note that the red light emitting micro-LED 100R may be configured to convert the blue light, which is emitted from the blue light emitting micro-LED 100B, into the red light by a wavelength conversion material such as a phosphor, a quantum dot, a quantum rod, a perovskite quantum dot, or a fluorescent dye. Similarly, the green light emitting micro-LED 100G may be configured to convert the blue light, which is emitted from the blue light emitting micro-LED 100B, into the green light by the wavelength conversion material.

In the following description, a configuration in which the N-side layer 11 is disposed on the light emitting side in the compound semiconductor 14 constituting the micro-LED 100 will be exclusively described. The compound semiconductor 14 may have a configuration in which the P-side layer 13 is disposed on the light emitting side.

Although each of the N-side layer 11, the light emitting layer 12, and the P-side layer 13 is usually optimized to include a plurality of layers instead of a single layer, the detailed structure of each layer is not described because it is not directly related to the present disclosure. Further, although the light emitting layer 12 is usually interposed between the N-type layer and the P-type layer, since the N-type layer or the P-type layer may include a non-doped layer or, in some cases, a layer having a dopant with opposite conductivity, thereby, hereinafter, the N-side layer 11 and the P-side layer 13 are simply referred to as the N-side layer and the P-side layer.

As shown in FIG. 3A, the micro-LED 100 may be a single-sided electrode type in which the P-electrode 30 and the N-electrode 31 are disposed on the same surface. Further, as shown in FIG. 3B, the micro-LED 100 may be an upper-and-lower electrode type in which the P-electrode 30 and the N-electrode 31 are disposed on surfaces opposite to each other. The protection film 20 generally has transparent insulation such as $SiO_2$, SiN, SiON, or SiOC, covers the side wall of the light emitting layer 12, electrically insulates, and protects the light emitting layer 12 from adhesion and intrusion of impurities. The light output can be increased by inclining the side walls covering the light emitting layer 12 to substantially 45°±15° so as to open with respect to the light emitting direction as shown in FIGS. 3A and 3B. Further, the light output also can be increased by inclining the side surfaces of the N-side layer 11 so as to open with respect to the light emitting direction as shown in FIGS. 3A and 3B.

The micro-LED 100 is disposed on the backplane substrate 50 using a so-called pick & place method. In the pick & place method, generally, among a micro-LED group formed on a growth substrate, a plurality of micro-LEDs 100 at the same interval as a pixel pitch of the image display device 200 are thinned and picked up, and are simultaneously disposed on the backplane substrate 50. Hereinafter, this operation is referred to as transfer.

In general, from 100 pieces of micro-LED 100 of 10 rows and 10 columns, to 10,000 pieces of micro-LED 100 of 100 rows and 100 columns, are picked up simultaneously and transferred to the backplane substrate 50. The micro-LEDs 100 are disposed in all the pixels on the backplane substrate 50 by repeating such transfer a plurality of times. In a case of full color, the above-described transfer processing is performed for each light emitting color. In the processing of picking up the micro-LED 100, there are a method in which an adsorption part is adsorbed using an adhesiveness of a polymer, and a method in which the adsorption part is adsorbed using an electrostatic chuck or a vacuum chuck. Since any transfer units can be used in the manufacturing processing of the image display device of the present disclosure, the transfer unit will not be described in detail.

Regarding Manufacturing Processing of Image Display Device 200

Figure 4:
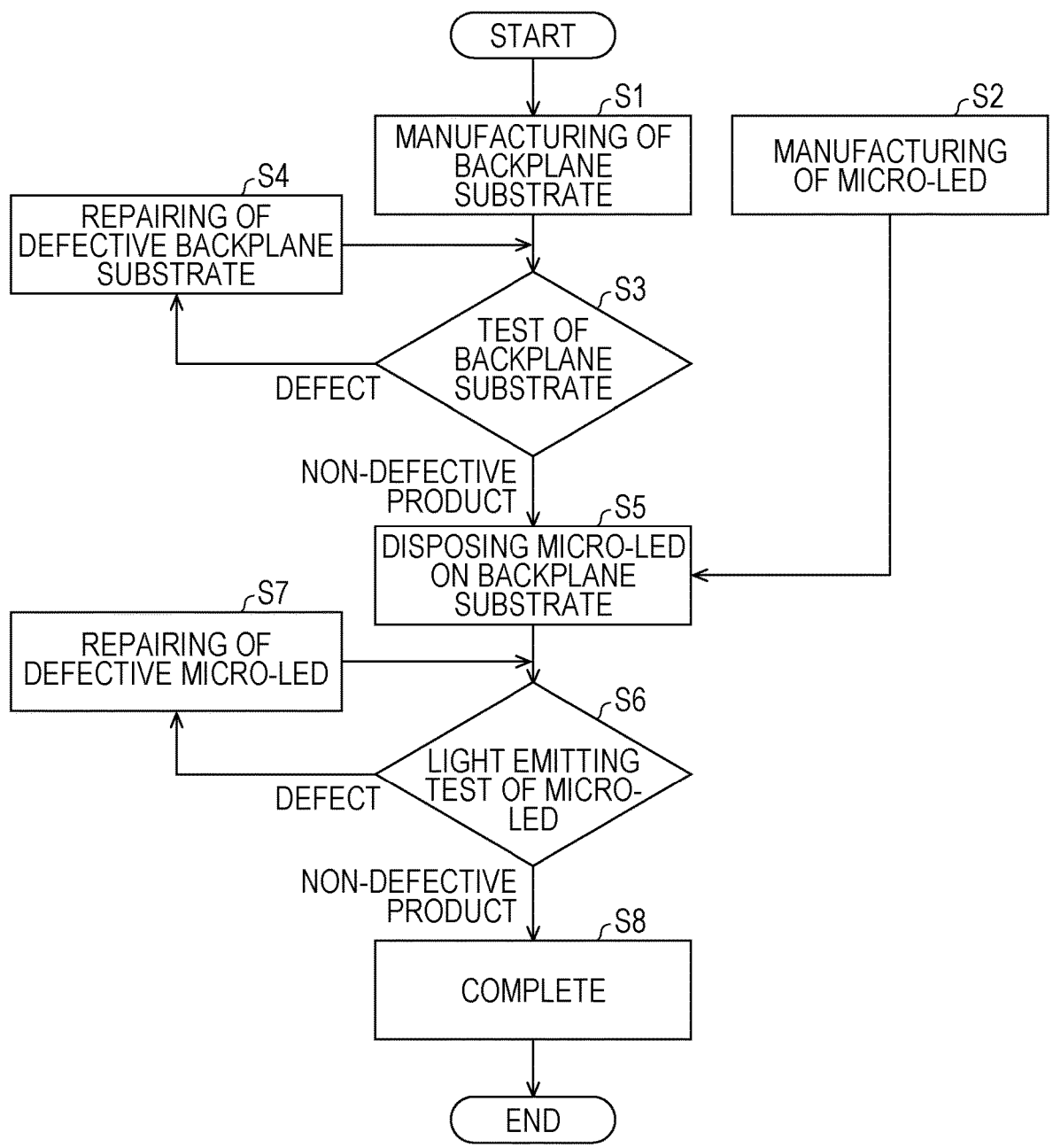
FIG. 4 is a flowchart showing manufacturing processing of the image display device of Embodiment 1.

FIG. 4 is a flowchart showing a flow of manufacturing processing of the image display device 200. In the manufacturing processing of the image display device 200, first, the backplane substrate 50 is manufactured (step S1).

In the processing of step S1, the thin film transistor TFT and the wiring are formed on the substrate 60. In the pixel region 1, the protection film 68 of a micro-LED disposing region or a redundant micro-LED disposing region is opened, and the first terminal 51P, the second terminal 51N, and the like are exposed. This processing is the same as that of a liquid crystal display device or an organic EL display device.

Further, in parallel with the processing of step S1, the micro-LED 100 is manufactured (step S2).

In processing of step S2, the compound semiconductor 14 is grown on a growth substrate and processed to form the P-electrode 30 and the N-electrode 31. The processing of step S2 may include processing of peeling the growth substrate. The micro-LED 100 is individualized and processed into a form that can be picked up individually. The individualized micro-LED 100 may be disposed again on another substrate or film.

Next, the test of the backplane substrate 50 is performed (step S3).

In the test in step S3, the test is performed whether or not all the pixel circuits 3 on the backplane substrate 50 can flow a predetermined amount of current. That is, a current measurement of each pixel circuit 3 is performed. The pixel circuit 3 is provided with a current path so that the test of the pixel circuit 3 can be performed even before the micro-LED 100 is disposed, and the details will be described later.

When the row selection circuit 4 and the column signal output circuit 5 on the backplane substrate 50 are formed with separate chips and disposed on the backplane substrate 50, the test of the pixel circuit 3 may be performed by providing a pad on a row selection signal line or a column signal line and setting a probe on the pad. Alternatively, the test of the backplane substrate 50 may be performed after the chips of the row selection circuit 4 and the column signal output circuit 5 are disposed on the backplane substrate 50. When the row selection circuit 4 and the column signal output circuit 5 are formed on the backplane substrate 50 with the thin film transistors TFT, the current measurement of the pixel circuit 3 may be performed using circuits thereof. In this case, it may be tested whether the row selection circuit 4 and the column signal output circuit 5 operate correctly, and when there is an operation defect, a remedial measure may be taken using known technique.

When no defect is found in the pixel circuit 3 as a result of the test of the backplane substrate 50 in step S3 (non-defective product determination in step S3), the process proceeds to disposing processing of the micro-LED 100 (step S5). When a defect is found in the pixel circuit 3 as a result of the test of the backplane substrate 50 (defect determination in step S3), the process proceeds to the repairing processing of the defective pixel circuit 3 (step S4).

Repair of the defective pixel circuit 3 is performed (step S4).

In processing of step S4, the repaired backplane substrate 50 is again put into the test processing in step S3. After the repair, when it is determined that the product is non-defective in the test in step S3, the process proceeds to the disposing processing of the micro-LED 100 (step S5). On the other hand, when it is determined that the product is defective again in the test in step S3 without being repaired, the backplane substrate 50 is excluded as a defective product. Note that the method for repairing the pixel circuit 3 will be described later.

The micro-LED 100 manufactured in step S2 is transferred onto the backplane substrate 50, which is determined to be a non-defective product in the processing of step S3, by using the pick & place method (step S5).

In processing of step S5, a deficiency in micro-LED 100 may occur. Therefore, after transferring the micro-LED 100 onto the backplane substrate 50, for example, it is desirable to specify a location that is deficient in micro-LED 100 by an image recognition inspection, and dispose the micro-LED 100 differently on the specified location that is deficient in micro-LED 100. Moreover, when it is checked, by the image recognition inspection, that the micro-LED 100 is dropped other than the location where it is originally disposed, it is desirable to remove the micro-LED 100. Note that a physical deficiency or surplus of the micro-LED 100 disposed on the backplane substrate 50 may be dissolved in the processing of step S5, or may be dissolved together with the electrical defect in the repairing processing of the micro-LED in step S7 which will be described later.

The processing of step S5 also includes processing of disposing the micro-LED 100 on the backplane substrate 50 and electrically connecting the backplane substrate 50 and the micro-LED 100 to each other. In the present embodiment, since the P-electrode 30 and the N-electrode 31 of the micro-LED 100 are disposed on the same side as a connection surface, the P-electrode 30 and the N-electrode 31 of the micro-LED 100 are installed by facing the P-electrode 30 and the N-electrode 31 with the first terminal 51P and the second terminal 51N, which are configured with the uppermost interconnection layer of the backplane substrate 50, respectively, and the electrical connection between the backplane substrate 50 and the micro-LED 100 is formed after pressure or heating processing.

Note that when the backplane substrate 50 and the micro-LED 100 are electrically connected to each other, a conductive paste may be disposed between the electrode of the backplane substrate 50 and the electrode of the micro-LED 100. Further, a bump may be provided on one of the terminal of the backplane substrate 50 and the electrode of the micro-LED 100, and the backplane substrate 50 and the micro-LED 100 may be joined with a non-conductive resin (NCR).

Subsequently, a light emitting test of the micro-LED 100 is performed (step S6). Note that when the row selection circuit 4 or the column signal output circuit 5 are formed as separate chips and then disposed on the backplane substrate 50, it is desirable to complete the disposing before the step S6.

In the light emitting test in step S6, it is desirable to test not only the lighting but also the luminance gradation of the micro-LED 100. Moreover, in the light emitting test in step S6, it is desirable that the light emitting defect of the micro-LED 100 can be distinguished for each cause. For example, the light emitting defect of the micro-LED 100 may be caused by a conduction defect in which light is not emitted because a current does not flow through the micro-LED 100. The light emitting defect of the micro-LED 100 may be caused by a fact that a current flows through the micro-LED 100 but the light is not emitted, or a light emitting amount is not sufficient. Further, the light emitting defect of the micro-LED 100 may be caused by a fact that the light is not emitted because a current amount flowing through the micro-LED 100 is too large.

Furthermore, when the backplane substrate 50 supports a full color display, it is desirable that the light emitting test in step S6 be performed for the respective colors of red, green, and blue. The light emitting test may be a manufacturing flow that is performed after the micro-LED 100 having a light emitting color of any one of the micro-LEDs 100R, 100G, and 100B is disposed on the backplane substrate 50 to repair the defective portion of the micro-LED 100 having the light emitting color, and then proceeds to the disposing of the micro-LED 100 having a next light emitting color. The micro-LEDs 100 having respective colors of the micro-LEDs 100R, 100G, and 100B, may be collectively disposed on the backplane substrate 50, thereafter, a light emitting test of each light emitting colors may be collectively performed.

When it is determined that the product is non-defective in the light emitting test in step S6, the process proceeds to step S8. When it is determined that the product is defective in the light emitting test in step S6, the process proceeds to step S7.

When it is determined that the product is defective in the light emitting test in step S6, the repair of the micro-LED 100 is performed (step S7).

In step S7, regarding the micro-LED 100 determined to be defective, a redundant micro-LED 100 is disposed on the redundant micro-LED disposing location provided in advance on the backplane substrate 50. When the micro-LED 100, which is already installed and is determined to be defective, has a conduction defect through which no current flows, the micro-LED 100 may be left while it is connected to the backplane substrate 50. When the current flows through the micro-LED 100, which is already installed and is determined to be defective, it is desirable to disconnect the current path to the micro-LED 100. As described above, the backplane substrate 50 having the micro-LED 100 repaired is put into the light emitting test in step S6 again.

When the light emitting defect of the backplane substrate 50, whose the micro-LED 100 is repaired, still exists and it is determined that there is a defect again in step S6, the image display device 200 becomes defective. When the light emitting defect of the backplane substrate 50, whose the micro-LED 100 is repaired, is repaired and it is determined that there is no defect in the light emitting test in step S6, which is performed again, the process proceeds to step S8.

The image display device 200, which is provided with the backplane substrate 50 determined to be non-defective in step S6, is completed through formation of a protection layer for protecting the micro-LED 100, disposition of an optical member such as micro-lens and a reflector, installation of a cover glass, and the like (step S8).

According to these processing, since the micro-LED 100 is disposed on the backplane substrate 50, that has non-defective products in which there is no defect in the pixel circuit 3 or in which the defect in the pixel circuit 3 is repaired, the yield of the image display device 200 can be improved. With regard to the defect of the micro-LED 100, only the micro-LED 100 in which the defect is found can be replaced and repaired, so that the material cost can be reduced. As described above, according to the processing of the present embodiment, the manufacturing cost can be sharply reduced by enhancing the yield of the image display device 200 and reducing the material cost.

Generally, in the organic EL device which is a self light emitting display device, a plurality of image display devices are disposed on one glass substrate. Then, an organic EL layer is simultaneously formed with respect to all the image display devices, and an upper layer electrode is further formed thereon. In general, no current can flow through the organic EL layer until the upper electrode is completed, so no test is performed before the organic EL layer is deposited. Even when the test can be performed, dust is generated by the test processing, which causes an occurrence of a defect in a depositing processing of the organic EL layer later, thereby, it is very difficult to test before the deposition of the organic EL layer.

On the other hand, in the image display device 200 using the micro-LED 100, the image display device 200 can be completed by disposing the micro-LED 100 on each backplane substrate 50. Therefore, there is a possibility that the yield can be improved by performing the test of the backplane substrate 50 before disposing the micro-LED 100 and excluding the defective product. Particularly, in the image display device 200, a ratio of the disposing processing of the micro-LED 100 to the manufacturing cost is large. Therefore, the effect of transferring the micro-LED 100 only to the non-defective backplane substrate 50, is large.

In the present embodiment, the manufacture of the micro-LED 100 which is the light emitting portion is performed independently of the manufacture of the backplane substrate 50. Steps S1 and S2 do not affect each other. Therefore, the micro-LED is defective due to the backplane substrate 50 only when a large dust adheres to the disposing region of the micro-LED 100 and the connection between the micro-LED 100 and the pixel circuit 3 is interrupted. On the other hand, in a case of the organic EL device, when a little dust adheres to a location where the organic EL film is deposited, a defect is occurred in the organic EL layer which is a light emitting portion.

The micro-LED 100 is not sensitive to dust as compared to the organic EL. Further, the size of the micro-LED 100 is usually several tens of μm and a few μm at the very least, and the size of the electrode connected to the backplane substrate 50 is also at least in the order of μm. Therefore, the problematic dust size is also in the order of μm, and management is also easy. However, in organic EL, it is desirable to manage small dust of the order of nm. Therefore, the effect of dust from testing the backplane substrate 50 before disposing the micro-LED 100 on the backplane substrate 50, is very small as compared to the case where the same processing is applied to the organic EL, and therefore, the image display device 200 can be suitably manufactured by the processing described above.

Regarding Configuration of Pixel Circuit 3

Figure 5A:
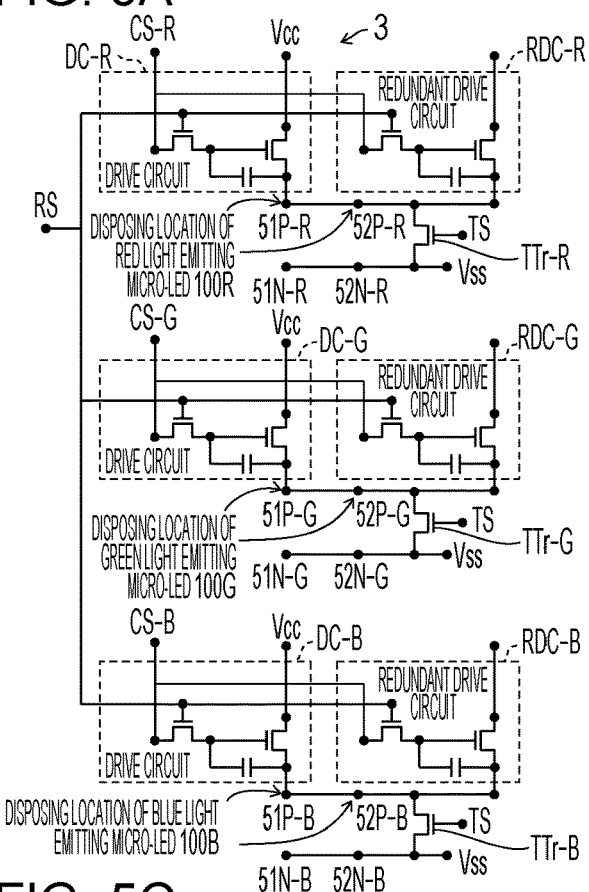
FIG. 5A is an equivalent circuit view of a pixel circuit.
Figure 6:
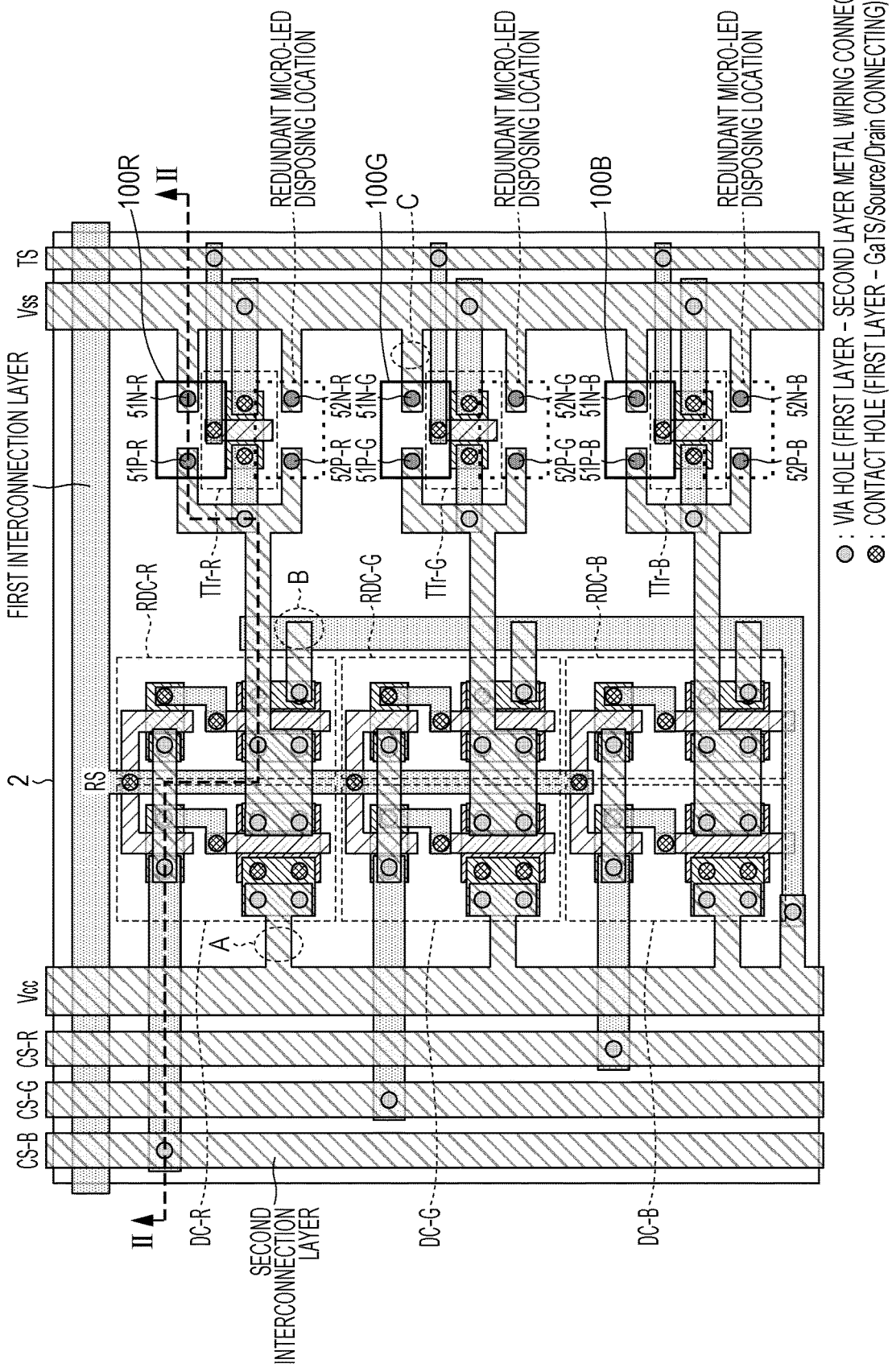
FIG. 6 is a view showing a layout configuration of a pixel of the image display device of Embodiment 1.

FIG. 5A is an equivalent circuit view of the pixel circuit 3, and FIG. 6 is a layout view of the pixel circuit 3. Hereinafter, a function of the pixel circuit 3 will be described with reference to FIG. 5A and FIG. 6.

FIG. 5A is an equivalent circuit view of the pixel circuit 3 when the image display device 200 performs a full color display, and as shown in FIG. 5A, in the pixel circuit 3, light intensity signals of respective micro-LEDs 100R, 100G, and 100B of red, green, and blue, are transmitted via separate column signal lines CS-R, CS-G, and CS-B, respectively. Further, in the pixel circuit 3, the light intensity signals of the respective micro-LEDs 100R, 100G, and 100B are simultaneously read by the signals of the common row selection signal line RS.

The pixel circuit 3 may include individual row selection signal lines (for example, RS-R, RS-G, and RS-B), and the light intensity signals of the respective micro-LEDs 100R, 100G, and 100B may be read sequentially in time series by one column signal line (CS).

Although FIGS. 5A to 5D show a circuit having the simplest configuration that has two transistors and one capacitor as a drive circuit DC of the micro-LED 100, the present embodiment is not limited to this and another drive circuit configuration may be used. The transistor is configured with an NMOS-FET, but a PMOS-FET may be used or a CMOS structure may be used. In a case where a leakage current of the transistor can be ignored as in the case of the oxide semiconductor, the capacitor can be omitted.

As shown in FIG. 6, in the pixel 2, the row selection signal line RS is configured with the first interconnection layer, and the column signal lines CS-R, CS-G, CS-B, a power supply line Vcc, a ground line Vss, and a test signal line TS is configured with the second interconnection layer. Note that in the layout in FIG. 6, in order to avoid a complication of the view, an illustration of the capacitor constituting the drive circuit DC is omitted. The sectional view along line II-II in FIG. 6 corresponds to FIG. 2. A wiring configuration in the pixel 2 is not limited to the configuration shown in FIG. 6, and may be different from the configuration shown in FIG. 6.

In the example of the layout shown in FIG. 6, the P-electrode 30 and the N-electrode 31 of a first micro-LED 100 are connected to the first terminal 51P which is connected to the drive circuit DC and the second terminal 51N which is connected to Vss, respectively. The first micro-LED 100 is a micro-LED 100 that is firstly disposed on the pixel 2. Similarly, at a second micro-LED 100, the P-electrode 30 and the N-electrode 31 of the second micro-LED 100 are connected to a first terminal 52P which is connected to the drive circuit DC and a second terminal 52N which is connected to Vss, respectively. The second micro-LED 100 is a redundant micro-LED 100 disposed in the pixel 2 when the first micro-LED 100 becomes defective.

A pair of wiring lines, which is connected to the drive circuit DC and the ground line Vss, is provided independently for the respective subpixels of red, green, and blue (a red subpixel 8, a green subpixel 7, and a blue subpixel 6), in two sets (one set with the first terminal 51P and the second terminal 51N, and one set with the first terminal 52P and the second terminal 52N). The first terminal 51P and the second terminal 51N, and the first terminal 52P and the second terminal 52N are connected to a circuit and wiring in the pixel circuit 3, and are configured as a part of the pixel circuit 3. Further, the first terminal 51P and the second terminal 51N, and the first terminal 52P and the second terminal 52N are all part of the uppermost interconnection layer of the pixel circuit 3.

In the example shown in FIG. 6, although the micro-LED 100 is installed at a location not substantially overlapping the drive circuit DC, the present embodiment is not limited to this, and the micro-LED 100 may be installed overlapping the drive circuit DC. The micro-LED 100 is not limited to a configuration in which the drive circuit DC and the ground line Vss are connected in two sets of wiring lines, and may be connected with three or more sets of wiring lines.

Further, as shown in FIG. 5A, in addition to a normal drive circuit DC (first LED drive circuit), a test transistor TTr which is a switching device and a redundant drive circuit RDC (second LED drive circuit) are added to the installation locations of each micro-LED 100. That is, in the pixel 2, the normal drive circuit DC for supplying a current to the micro-LED 100 and the redundant drive circuit RDC that substitutes for the normal drive circuit DC are disposed for each of the subpixels 6, 7 and 8.

The test transistor TTr is a transistor for short-circuiting a pair of wiring lines, which is an installation location of the micro-LED 100, and can test the characteristics of the drive circuit DC by turning on the test transistor TTr before disposing the micro-LED 100. The test transistor TTr is turned on only when the test of the pixel circuit 3 is performed before the installation of the micro-LED 100, and is always kept in the off mode when the image display device 200 is in actual operation. The test transistor TTr is controlled to be turned-on and turned-off by the test signal line TS.

The redundant drive circuit RDC is a redundant drive circuit used when the drive circuit DC is defective and a current does not flow through the micro-LED 100. In the configuration shown in FIG. 5A, the redundant drive circuit RDC differs from the drive circuit DC in that the redundant drive circuit RDC is not connected to the power supply line Vcc. The redundant drive circuit RDC is configured to include a thin film transistor disposed on the backplane substrate 50.

Figure 5B:
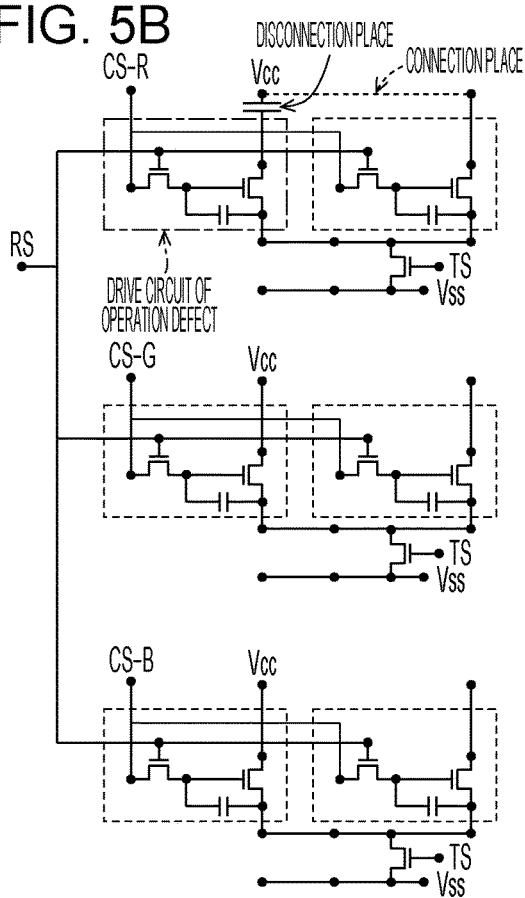
FIG. 5B is an equivalent circuit view of the pixel circuit for explaining repair of a defective drive circuit.

FIG. 5B is an equivalent circuit view of the pixel circuit 3 for explaining the wiring connection when repairing the defective drive circuit. As shown in FIG. 5B, for example, when the drive circuit DC-R for the micro-LED 100R emitting red light becomes defective, the drive circuit DC-R can be switched with the redundant drive circuit RDC-R by connecting the RDC-R power supply line to the Vcc wiring and disconnecting the DC-R power supply line.

Note that in the configuration in FIG. 5B, the redundant drive circuits RDC are individually provided in the respective subpixels of red, green, and blue. This configuration is beneficial in that switching the drive circuit DC with the redundant drive circuit RDC is possible with a wiring disconnection in one place and a wiring connection in one place, and the time for redundant switching is small. For example, in FIG. 6, the second interconnection layer may be disconnected at a place A in the figure, and the first interconnection layer and the second interconnection layer may be welded at a place B in the figure. Even when a drive voltage or a drive current differs by the micro-LEDs 100R, 100G, and 100B, there is an advantage that respective appropriate redundant drive circuits RDC can be prepared. Note that for such circuit repair, by using a laser beam or a focused ion beam (FIB), it is possible to melt and disconnect the wiring, and possible to connect the wiring lines by depositing or welding the conductive material. Since these wiring techniques are known techniques, a detailed description will be omitted.

As described above, at least two sets of a pair of wiring lines (one set with the first terminal 51P and the second terminal 51N, and one set with the first terminal 52P and the second terminal 52N), that is connected to a pair of electrodes 30 and 31 of the micro-LED 100 and is connected to the pixel circuit 3, are disposed on the pixel 2. The pixel circuit 3 has a first LED drive circuit (normal LED drive circuit DC) for supplying a current through the micro-LED 100, and a second LED drive circuit (redundant drive circuit RDC) that substitutes for the first LED drive circuit. The pixel circuit 3 further includes a test transistor TTr which is a switching device for short-circuiting the pair of wiring lines.

The pixel 2 has at least one micro-LED 100, and the corresponding pixel circuit 3 is provided on the backplane substrate 50. The pixel circuit 3 has a set of signal lines, a power supply line and a ground line, a first LED drive circuit (normal drive circuit DC) for supplying a current to the micro-LED 100, a second LED drive circuit (redundant drive circuit RDC) which substitutes the first LED drive circuit, a plurality of pairs of a first terminal and a second terminal (one set with the first terminal 51P and the second terminal 51N, and one set with the first terminal 52P and the second terminal 52N), wiring which connects the first terminals (the first terminal 51P and the first terminal 52P) to the first LED drive circuit, and a test transistor TTr which is a switching device for short-circuiting a pair of a first terminal and a second terminal. A pair of electrodes 30 and 31 of the micro-LED 100 is connected to a pair of a first terminal and a second terminal (the first terminal 51P and the second terminal 51N). Further, in the present configuration, the pixel 2 includes three subpixels, each subpixel includes at least one micro-LED, and each subpixel individually has a pixel circuit.

Regarding Repair of Micro-LED 100

After the repair of the drive circuit DC, that drives each of the micro-LEDs 100, is completed and it is checked that the backplane substrate 50 is a non-defective product, the micro-LED 100 is disposed. In the disposing processing of the micro-LED 100, first, for the respective light emitting colors of red, green, and blue, the micro-LED 100 is disposed at only one place among a plurality of micro-LED 100 disposing locations.

Figure 5C:
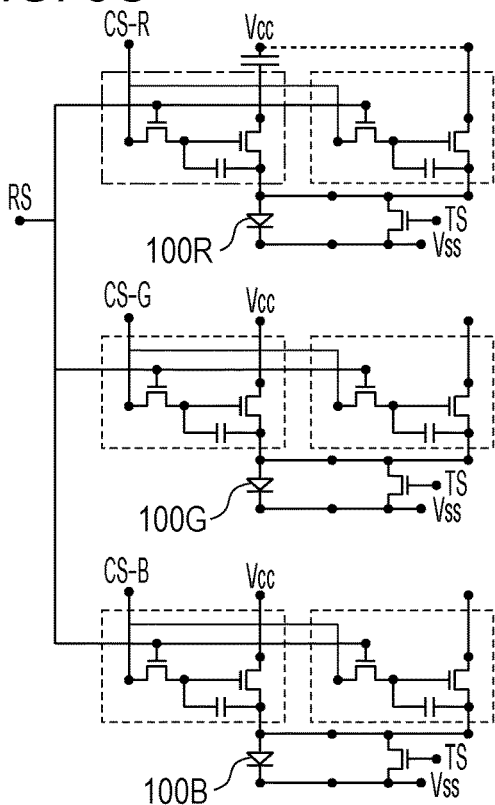
FIG. 5C is an equivalent circuit view of the pixel circuit disposed with the micro-LED.

FIG. 5C is an equivalent circuit view of the pixel circuit 3 on which the micro-LED 100 is disposed. As shown in FIG. 5C, one red light emitting micro-LED 100R, one green light emitting micro-LED 100G, and one blue light emitting micro-LED 100B are disposed on the red subpixel 8, the green subpixel 7, and the blue subpixel 6, respectively. Since the disposed micro-LEDs 100 operate normally in the majority of the pixels 2, by disposing the micro-LED 100 on each of the subpixels 6, 7 and 8 as described above, the cost desired for the micro-LED 100 is sharply reduced as compared with the case where a plurality of micro-LEDs 100 are disposed in parallel. When the micro-LED 100 is disposed and a light emitting defect is found as a result of performing a light emitting test, a new micro-LED 100 can be disposed at the prepared micro-LED disposing location.

Figure 5D:
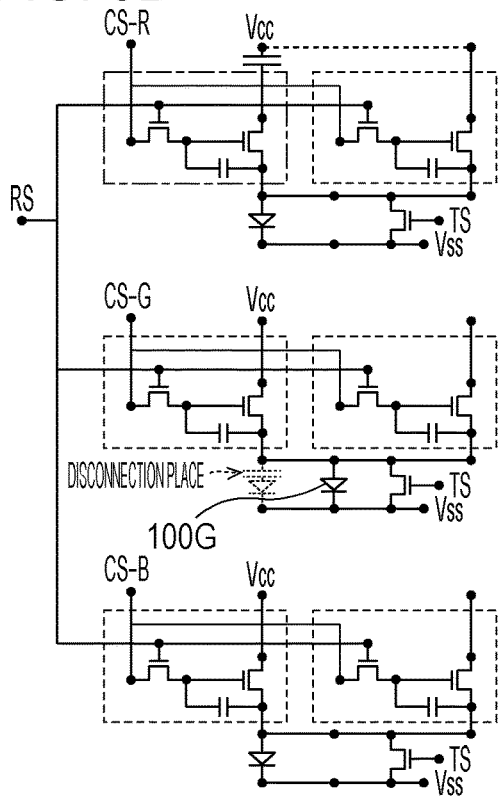
FIG. 5D is an equivalent circuit view of the pixel circuit for explaining repair of a defective micro-LED.

FIG. 5D is an equivalent circuit view of the pixel circuit 3 for explaining the repair of the micro-LED 100 in which the light emitting defect is found. As shown in FIG. 5D, for example, when the green light emitting micro-LED 100G has a light emitting defect, a new green light emitting micro-LED 100G is disposed at a prepared installation location. In this case, only one chip of the redundant micro-LED 100G is disposed at the prepared installation location. A connection method of the redundant micro-LED 100 to the pixel circuit 3 may be the same as the first time connection method, and may be another method.

When a leakage current flows through the micro-LED 100G in which the light emitting defect is found, it is desirable to disconnect the current path to the micro-LED 100G. For example, in FIG. 6, it is desirable to disconnect the wiring at a place C in the figure. The disconnection place may be on the ground side or the drive circuit DC side with respect to the micro-LED 100. As described above, it is desirable to make the current flow at 100% through the newly connected redundant micro-LED 100 by disconnecting the leakage current to the micro-LED 100G in which the light emitting defect is found.

As described above, various defects may occur in the subpixels 6, 7 and 8 on which the micro-LED 100 is newly disposed. These defects include, for example, a conduction defect in which no current flows through the micro-LED 100, a short-circuit defect in which the micro-LED 100 does not emit light even though the current flows through the micro-LED 100, a light emitting defect in which the light emitting intensity of the micro-LED 100 is weak or abnormally strong, a wavelength defect in which the light emitting wavelength of the micro-LED 100 deviates from a specified value, and the like.

Further, the cause of a defect in the micro-LED 100 is due to a connection defect, or due to a defect in the micro-LED 100 itself. Other than the defect in which no current flows through the micro-LED 100 due to the conduction defect, it is desirable to disconnect the current path of the micro-LED 100 in which the defect is found and then replace the micro-LED 100 with the redundant micro-LED 100. This is because the micro-LED 100 that does not operate normally may cause a reliability defect later. In order to control variations in the light emitting intensity of the plurality of micro-LEDs 100 to realize a uniform display, it is desirable that the micro-LED 100 that does not satisfy the specified luminance (for example, the luminance exceeding a range of ±10% from a center value) is substituted. Furthermore, it is desirable that the micro-LED 100 whose light emitting wavelength does not satisfy the specified value is substituted as well.

As described above, in the previous processing, since the micro-LED 100 is disposed after the pixel circuit 3 is checked to be normal, the defect found in the light emitting test of the micro-LED 100 can be removed by replacing the micro-LED 100. Therefore, the yield in the disposing processing of the micro-LED 100 is very close to 100%, and the manufacturing cost can be sharply reduced.

The defect caused by an initial disposing of the micro-LED 100 is at most 0.1% of all the micro-LEDs 100, and can be reduced to 100 ppm or less when the process becomes proficient. Therefore, the material cost itself of the micro-LED 100 desired to the repair can also be 0.01% or less of the whole, and can be a negligible level to the manufacturing cost of the entire processing.

Furthermore, the cost desired to repair the micro-LED 100 is proportional to the number of repaired places. Therefore, when the degree of completion of the process is increased, it can be reduced to 100 ppm or less of the whole, so the image display device 200 of a full high definition (FHD) class becomes 600 points or less. This is an amount that can be accommodated using a normal bonder. Therefore, the repair cost of the micro-LED 100 can be removed as a big problem by developing a dedicated bonder on which the micro-LED 100 can be disposed alone.

In rare cases, in the light emitting test of the micro-LED 100, a defect of the pixel circuit 3 may become apparent. This is a case, for example, when a voltage drop in the drive circuit DC is large. As described above, in the disposing processing of the micro-LED 100, there is a small number of cases where defects newly occur. Therefore, in such a case, it is possible to additionally perform a repair of the problematic subpixels 6, 7, and 8 of the pixel circuit 3.

Structure and Connection Method of Micro-LED 100

Figure 7A:
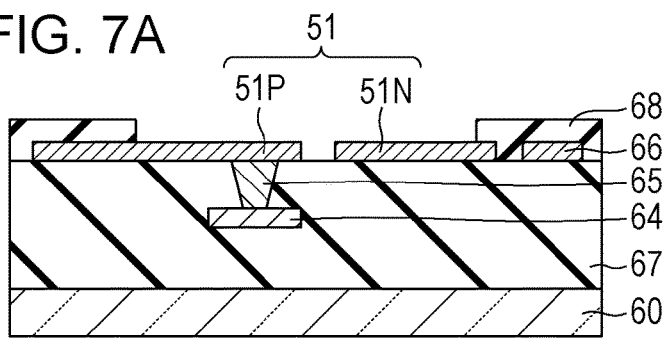
FIGS. 7A to 7D are sectional views for explaining disposing of micro-LED of Embodiment 1.

As shown in FIG. 3A, the micro-LED 100 of the present embodiment is a single-sided electrode type. The connection processing of such a single-sided electrode type micro-LED 100 will be described below. FIGS. 7A to 7E are views showing connection processing of the micro-LED 100. First, as shown in FIG. 7A, on the backplane substrate 50, the micro-LED connection portion 51 is formed in which the uppermost interconnection layer (in this case, the second interconnection layer) 66 is exposed from the protection film 68. The micro-LED connection portion 51 includes the first terminal 51P and the second terminal 51N. The P-electrode 30 of the micro-LED 100 is connected to the first terminal 51P. The N-electrode 31 of the micro-LED 100 is connected to the second terminal 51N. The two exposed portions of the uppermost interconnection layer 66 of the backplane substrate 50 may be referred to as electrodes.

Figure 7B:
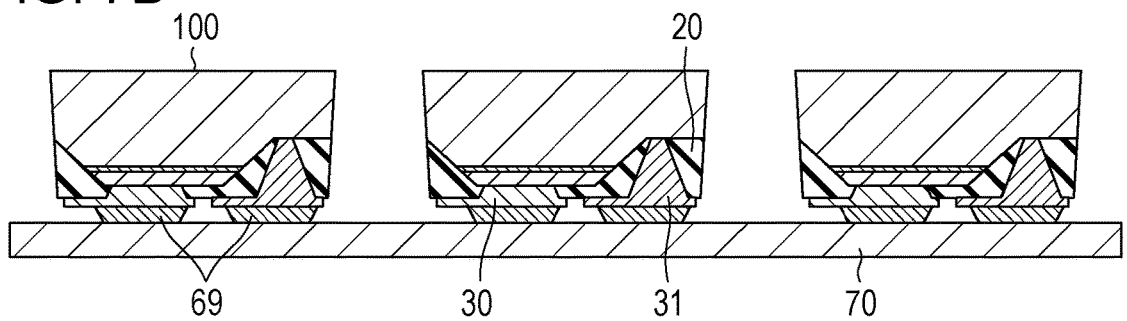

As shown in FIG. 7B, the micro-LEDs 100 are individualized and arranged on a protection sheet 70. Connection materials 69 are provided on the P-electrode 30 and the N-electrode 31, and are disposed with the electrode side facing the protection sheet 70 side. The connection material 69 is, for example, a bump with various sizes formed of a conductive material, and physically connected to the wiring on the backplane substrate 50 side to facilitate the formation of an electrical connection. Note that the connection material 69 may be provided on the uppermost interconnection layer 66 of the micro-LED connection portion 51 on the backplane substrate 50.

Figure 7C:
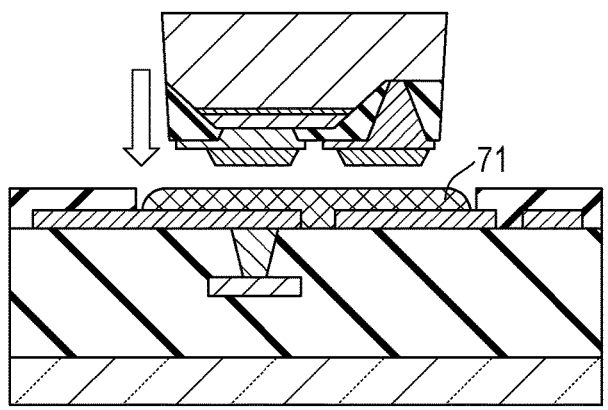

As shown in FIG. 7C, just before connecting the micro-LED 100, an NCR 71 which is a non-conductive resin is applied to the micro-LED connection portion 51 of the backplane substrate 50. The application of the NCR 71 is performed, for example, using a printing method or the like. After applying the NCR 71 to the micro-LED connection portion 51, the micro-LED 100 is crimped onto the backplane substrate 50 by a bonding device. A solidification of the NCR 71 may be performed on the spot, or may be performed after the disposing of all the micro-LEDs 100 on the backplane substrate 50 is completed. The NCR 71 may have a thermosetting property or a photo-curing property.

Figure 7D:
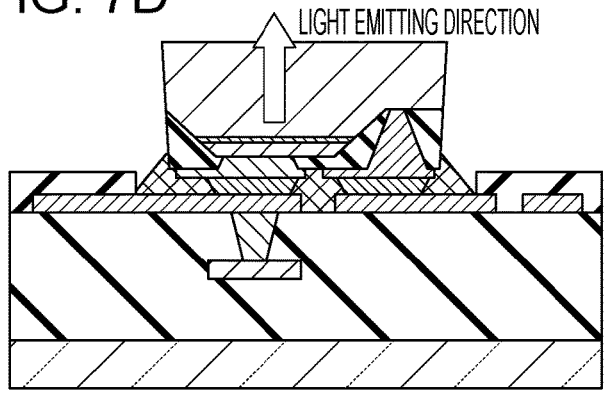

As shown in FIG. 7D, by a cure shrinkage of the NCR 71, the micro-LED 100 is crimped to the second interconnection layer 66 and the electrical connection between the connection material 69 and the second interconnection layer 66 is secured.

Figure 7E:
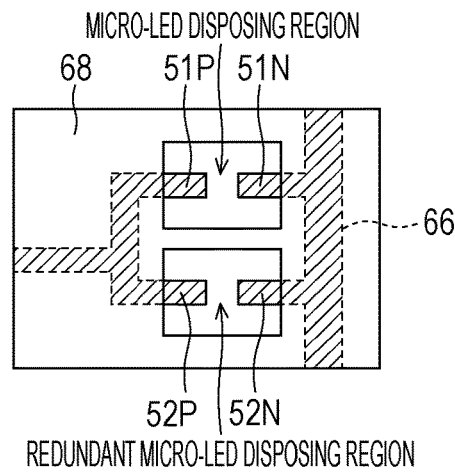
FIG. 7E is a view showing connection processing of the micro-LED.

As shown in FIG. 7E, the protection film 68 is opened in a region where the micro-LED 100 is installed. Further, in the region where the micro-LED 100 is installed, it is desirable that two sets of micro-LED connection portions 51 and 52 be separated from each other by the protection film 68. This is for the NCR 71 not to spread to the micro-LED connection portion 52 of the second micro-LED 100 when applying the NCR 71 to the micro-LED connection portion 51 of the first micro-LED 100.

The P-electrode 30 and the N-electrode 31 are disposed on the surface of the micro-LED 100, the surface facing the backplane substrate 50. For this reason, the micro-LED 100 less likely to emit light to the backplane substrate 50 side, and normally, the light emitted from the micro-LED 100 is extracted to side facing away from the backplane substrate 50. Therefore, the wiring can be disposed also in the micro-LED connection portion 51, and it becomes easy to overlap the pixel circuit 3 and the disposing location of the micro-LED 100, and easy to cope with a case where the pixel 2 is miniaturized in the backplane substrate 50.

Further, since there is nothing to block the light in a light emitting direction of the micro-LED 100, it is easy to provide a wavelength conversion material or the micro-lens on the backplane substrate 50. When the wavelength conversion material is used, an InGaN based blue light emitting LED having high light emitting efficiency and little temperature change of the light emitting efficiency can be used for the green light emitting micro-LED 100G or the red light emitting micro-LED 100R. As a result, the image display device 200 can be formed which has high light emitting efficiency and little temperature dependence of light emitting amount or light emitting wavelength. Further, by forming the micro-lens, it becomes possible to change the viewing angle dependency of the light emitting intensity or to apply the image display device 200 to a light field display.

Modification Example

Figure 8:
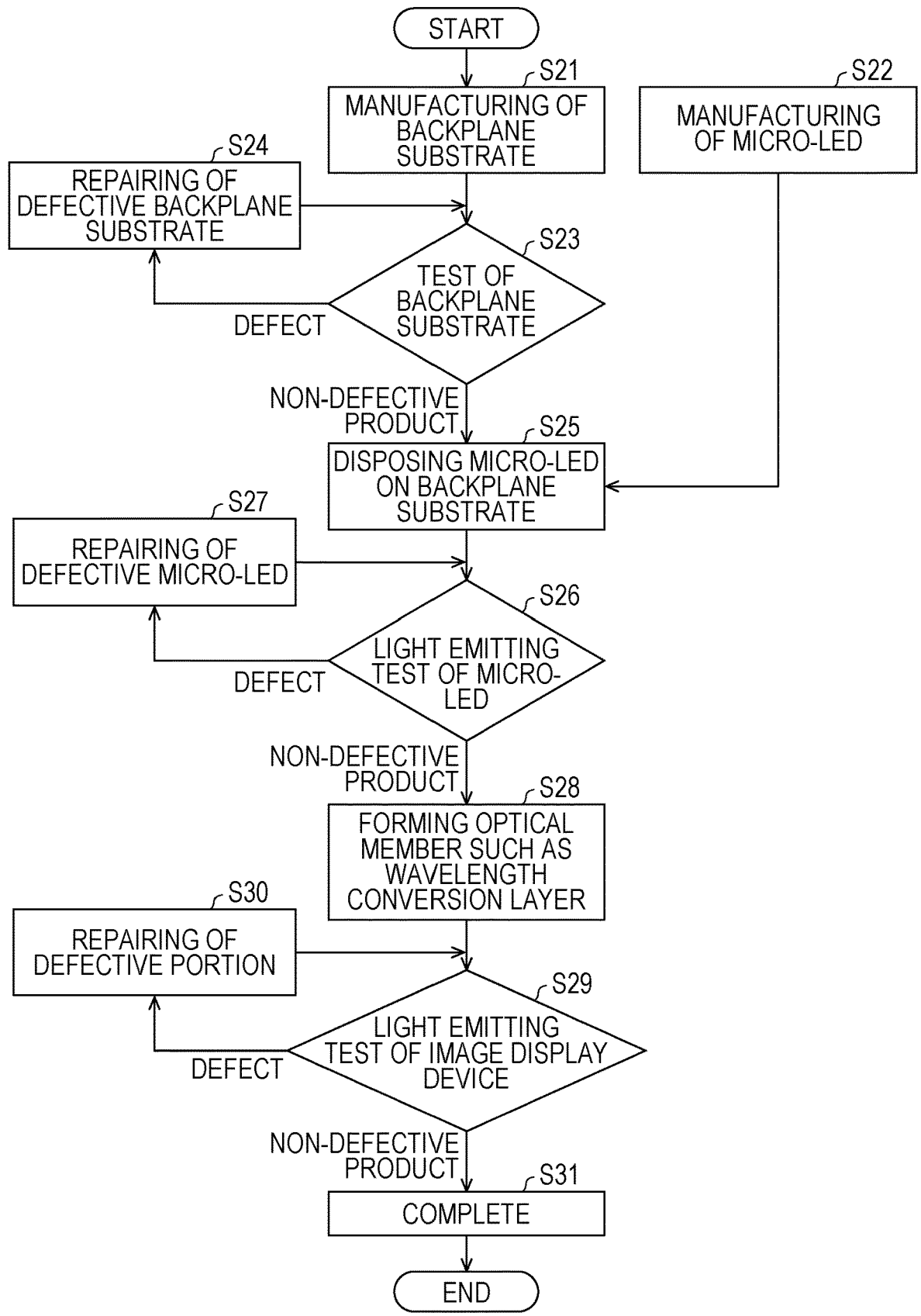
FIG. 8 is a flowchart showing manufacturing processing of the image display device of Modification Example of Embodiment 1.

FIG. 8 is a view showing a manufacturing processing of a modification example in a case where a wavelength conversion layer is used for the micro-LED 100 in Embodiment 1. In this modification example, the processing is more complicated than the manufacturing processing of Embodiment 1, but the processing of step S21 to step S27 are essentially the same as the processing of step S1 to step S7 in Embodiment 1. That is, before forming the wavelength conversion layer, for example, the light emitting test of the blue light emitting micro-LED 100B is performed (step S26) at a stage of transferring the blue light emitting micro-LED 100B, which becomes an excitation light source emitting an excitation light for the wavelength conversion layer, to the backplane substrate 50, and the repair of the micro-LED 100 is performed as desired (step S27).

Up to this stage, the image display device 200 emits monochromatic light, which emits monochromatic light with blue. At the stage when the excitation light of the wavelength conversion layer becomes as specified, forming processing of the wavelength conversion layer is performed (step S28). This processing may include processing of forming not only the wavelength conversion layer but also a micro-lens, a reflector, or the like.

Thereafter, the light emitting test of the image display device 200 is performed (step S29), and repair of the defective portion is performed as desired (step S30). In the repairing processing after the light emitting test, only the wavelength conversion layer may be removed, or it may be started from the processing of newly installing the blue light emitting micro-LED 100B which is an excitation light source. When the blue light emitting micro-LEDs 100B are installed apart from each other in the subpixel, a wavelength conversion layer or another optical member can be added to the blue light emitting micro-LED 100B which is newly installed in the repairing processing.

As described above, by converting the wavelength of the blue light emitting micro-LED 100B using the wavelength conversion layer, the same effect as that of Embodiment 1 can be obtained for the image display device 200 that performs full color display.

Embodiment 2

Embodiment 2 of the present disclosure will be described below. For the convenience of explanation, regarding the member which has the same function as the member demonstrated in the above Embodiment 1, the same reference sign is appended and the description is not repeated.

Figure 9A:
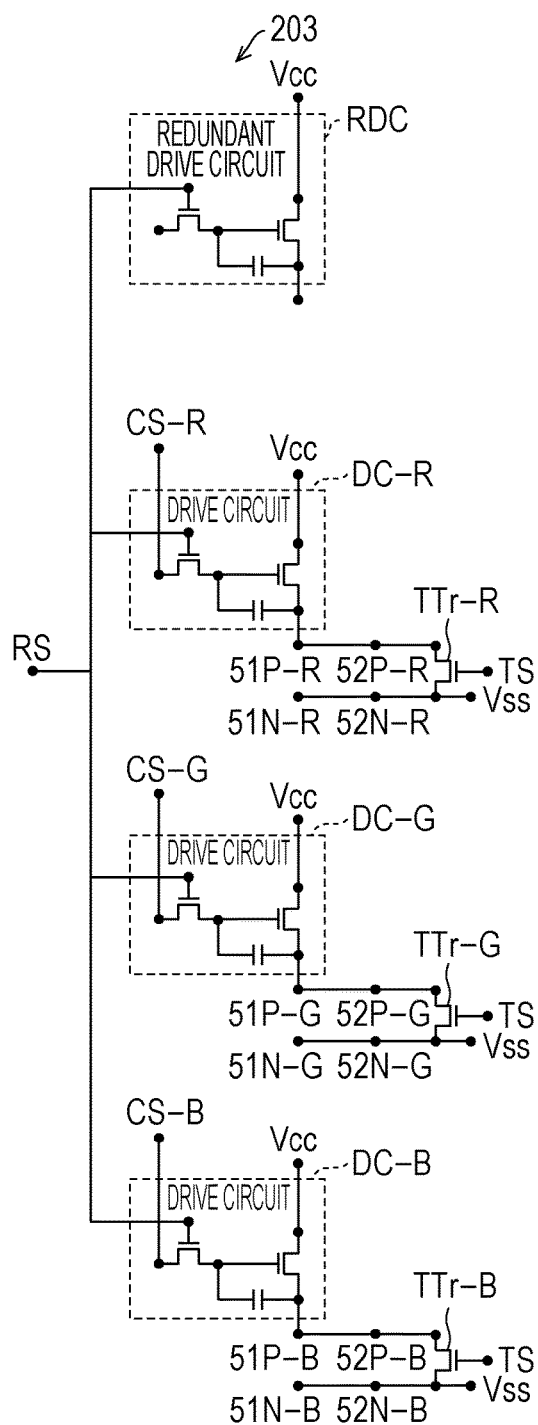
FIG. 9A is an equivalent circuit view of a pixel circuit according to Embodiment 2 of the present disclosure.

FIG. 9A is an equivalent circuit view of a pixel circuit 203 according to Embodiment 2. Embodiment 2 differs from Embodiment 1 in a disposition of the redundant drive circuit RDC (second LED drive circuit). The configuration of the image display device 200 other than the disposition of the redundant drive circuit RDC in the pixel circuit 203 is the same as that of Embodiment 1, and thus the description thereof is omitted.

As shown in FIG. 9A, only one redundant drive circuit RDC is provided for the pixel 2. When an area of the pixel 2 is large and the redundant drive circuit RDC can be disposed in each of the subpixels 6, 7, and 8 as in Embodiment 1, the configuration of Embodiment 1 is desirable. However, when the area of the pixel 2 is small and it is difficult to provide a plurality of redundant drive circuits RDC, one redundant drive circuit RDC may be disposed in the pixel 2. That is, one redundant drive circuit RDC may be shared by the entirety of the plurality of subpixels 6, 7, and 8 included in the pixel 2. Even in this case, members other than the redundant drive circuit DC are disposed for each of the subpixels 6, 7, and 8.

Figure 9B:
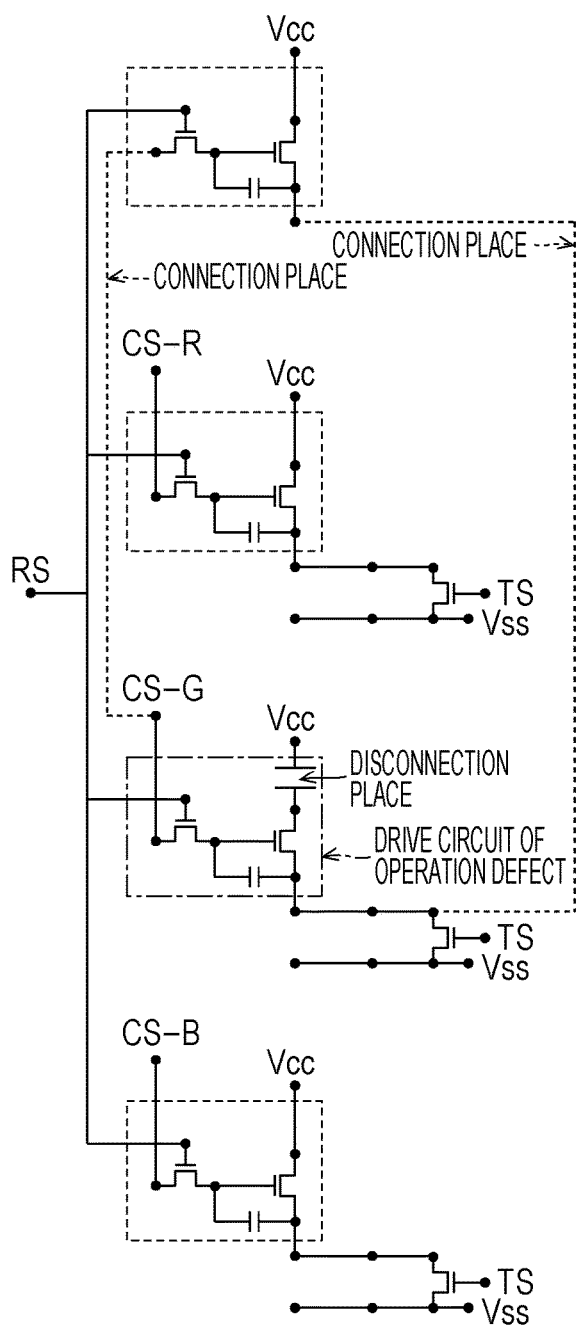
FIG. 9B is an equivalent circuit view of the pixel circuit for explaining repair of a defective drive circuit.

FIG. 9B is an equivalent circuit view of the pixel circuit 203 for explaining the repair of the defective drive circuit DC. As shown in FIG. 9B, for example, when the drive circuit DC-G for the green light emitting micro-LED 100G is defective, a wiring connection is desirable in two places between the drive circuit DC-G and the redundant drive circuit RDC at least. Wiring that connects an output of the redundant drive circuit RDC to the installation location of the green light emitting micro-LED 100G, and wiring that connects the green light emitting column signal CS-G to an input portion of the redundant drive circuit RDC are desirably made.

When a leakage current is generated in the defective drive circuit DC-G, it is desirable to disconnect a connection of the leakage current to the power supply line Vcc. As described above, when only one redundant drive circuit RDC is provided for the pixel 2, the number of connection places between the drive circuit DC and the redundant drive circuit RDC increases, but there is an advantage that the circuit area of the pixel 2 can be reduced.

As an extended form of Embodiment 2, it is also possible to share the redundant drive circuit RDC between the plurality of pixels 2. Although not shown, for example, it is also possible to share one redundant drive circuit RDC for the blue subpixel 6, one redundant drive circuit RDC for the green subpixel 7, and one redundant drive circuit RDC for the red subpixel 8 among three pixels 2. Further, one redundant drive circuit RDC can be shared between two pixels 2. An optimal configuration can be selected in consideration of the area for disposing the redundant drive circuit RDC and a remedial yield of the backplane substrate 50.

As described above, by the configuration of Embodiment 2, the same effect as that of Embodiment 1 can be realized. Particularly, according to the configuration of Embodiment 2, even when the area of the pixel 2 is small and many redundant drive circuits RDC are not able to be disposed, the pixel 2 in which the defect of the backplane substrate 50 is found can be repaired, and also there is an advantage that a configuration, which is capable of replacing the problematic micro-LED 100, can be used.

Embodiment 3

Embodiment 3 of the present disclosure will be described below. For the convenience of explanation, regarding the member which has the same function as the member demonstrated in the above Embodiment 1, the same reference sign is appended and the description is not repeated.

FIGS. 10A to 10H are sectional views showing a structure of the micro-LED 100 and a connection structure of the micro-LED 100 to the backplane substrate 50 according to Embodiment 3. The configuration of the image display device 200 other than the structure of the micro-LED 100 and the connection structure of the micro-LED 100 to the backplane substrate 50, is the same as that of Embodiment 1, and thus the description thereof is omitted.

In Embodiment 1, the micro-LED 100 is a single-sided electrode, and the electrode surface is disposed on the backplane substrate 50 side. In the micro-LED 100 of Embodiment 3, the electrode surface is disposed on a side facing away from the backplane substrate 50. The present embodiment will be described with reference to FIGS. 10A to 10H.

Figure 10A:
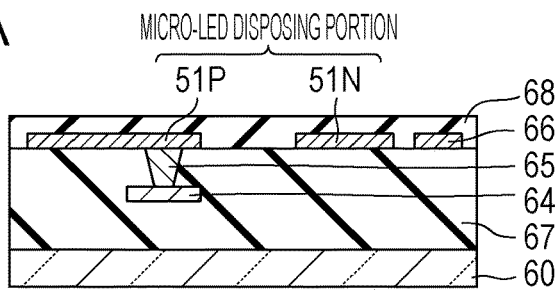
FIGS. 10A to 10H are a sectional view for explaining disposing of micro-LED according to Embodiment 3 of the present disclosure.

As shown in FIG. 10A, at the stage where the test processing (step S3 in Embodiment 1) and the repairing processing (step S4 in Embodiment 1) of the backplane substrate 50 are completed, the pixel region 1 is covered with the protection film 68, and the first terminal 51P, the second terminal 51N, the first terminal 52P, and the second terminal 52N are not exposed.

Figure 10B:
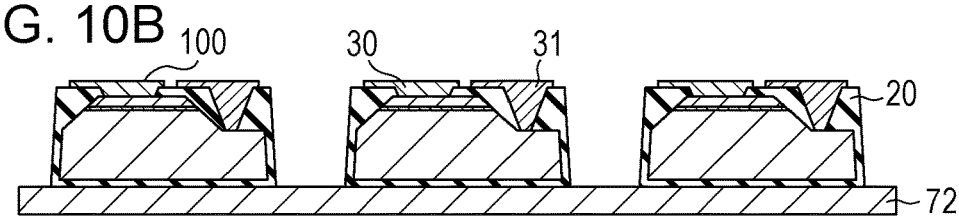

On the other hand, as shown in FIG. 10B, the micro-LED 100 is disposed on a maintaining substrate 72 such that both electrodes of the P-electrode 30 and the N-electrode 31 are disposed facing away from the maintaining substrate 72. Unlike Embodiment 1, at least a side wall portion of the micro-LED 100 is covered with a protection film 20 having insulation. This is because it is desirable to insulate the side wall portion in order to form wiring in later processing.

Figure 10C:
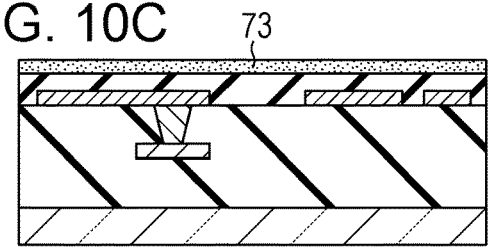

In the disposing processing of the micro-LED 100 (step S5 in Embodiment 1), as shown in FIG. 10C, a joining agent 73 is applied to the entire surface of the backplane substrate 50. The joining agent 73 may be a thermosetting type or a photo-curing type. Next, as shown in FIG. 10D, the micro-LED 100 is disposed on the surface of the backplane substrate 50 to which the joining agent 73 is applied. The micro-LED 100 is fixed on the surface of the backplane substrate 50 by the joining agent 73.

Figure 10F:
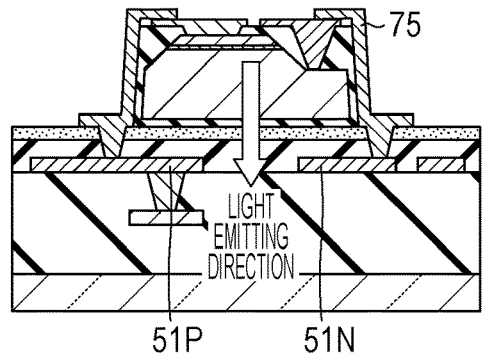
Figure 10D:
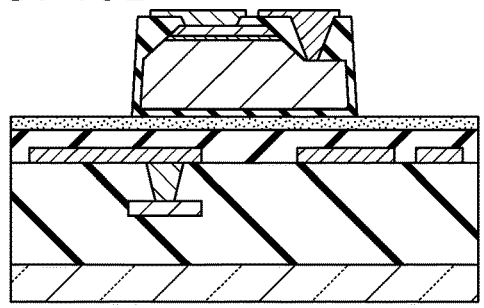
Figure 10G:
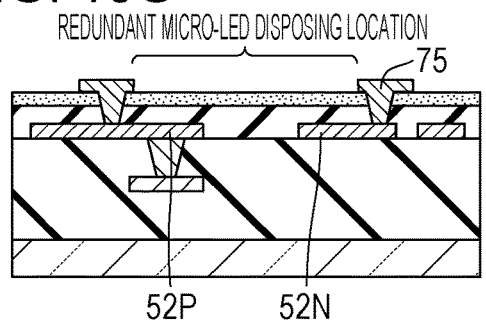
Figure 10E:
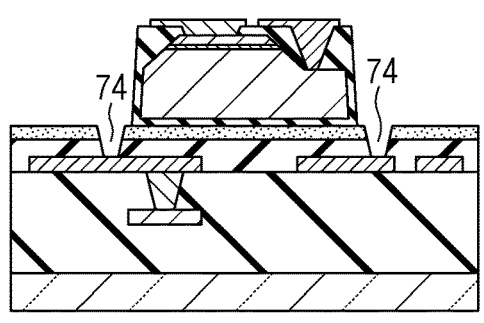

Next, as shown in FIG. 10E, connection holes 74 are opened on the first terminal 51P, the second terminal 51N, the first terminal 52P, and the second terminal 52N of the backplane substrate 50. The connection hole 74 is formed by performing a photolithography and etching of the protection film 68.

Furthermore, as shown in FIG. 10F, connection electrodes 75 that connect the P-electrode 30 and the N-electrode 31 of the micro-LED 100 to the first terminal 51P and the second terminal 51N of the backplane substrate 50, are formed on the backplane substrate 50. The connection electrode 75 is patterned by depositing a wiring layer on the backplane substrate 50, performing a photolithography, and etching of the wiring layer.

As described above, in Embodiment 3, the disposing processing of the micro-LED 100 does not simply transfer the micro-LED 100 onto the backplane substrate 50, but also includes processing of forming wiring that electrically connects both the P-electrode 30 and the N-electrode 31 of the micro-LED 100 with the pixel circuit 3.

In the image display device 200 of Embodiment 3, since the electrodes 30 and 31 of the micro-LED 100 are disposed on the surface opposite to the surface facing the backplane substrate 50, the light emitting direction of the micro-LED 100 becomes the circuit surface 50 side.

In the backplane substrate 50 of Embodiment 3 configured in this manner, it is considered that the repairing processing becomes complicated when a defect occurs in the micro-LED 100 and the redundant micro-LED 100 has to be disposed. In this case, when it is intended to form an electrode in the redundant micro-LED 100 in the same manner as the connection electrode 75, the insulation film has to be deposited again on the entire backplane substrate 50 on which the micro-LED 100 is disposed, the connection hole 74 has to be formed again, and the connection electrode 75 has to be formed, thereby, the processing becomes long.

Therefore, it is desirable to use another wiring forming method for the redundant micro-LED 100. For example, a laser beam can be used to connect the wiring layer and the electrodes 30 and 31 of the redundant micro-LED 100 together.

Figure 10H:
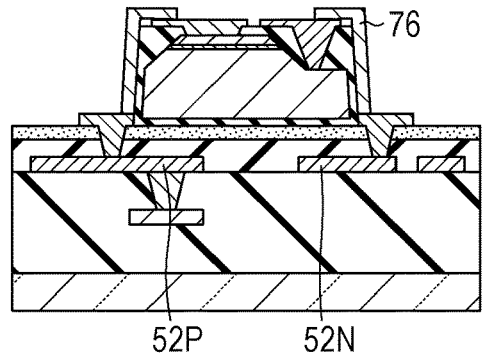

In particular, as shown in FIG. 10G, the connection holes 74 and the connection electrodes 75 covering the connection holes, are also formed for the first terminal 52P and the second terminal 52N of the redundant micro-LED 100, and as shown in FIG. 10H, the repair of the micro-LED 100 can be easily performed by forming a repair wiring 76 with a laser beam or the like.

As described above, even with the micro-LED 100 structure and the connection method shown in Embodiment 3, as in Embodiment 1, the pixel 2 in which a defect of the backplane substrate 50 is found can be repaired, and also it is possible to obtain an effect that the problematic micro-LED 100 can be replaced. Further, in Embodiment 3, since the connection between the electrodes 30 and 31 of the micro-LED 100, and the wiring layer of the backplane substrate 50 is formed by deposition of the conduction film in the semiconductor processing, there is an advantage that a connection defect hardly occurs. Therefore, although the wiring layer in Embodiment 3 has one more layer than Embodiment 1, it is possible to reduce the number of repaired places of the defective micro-LED 100 and reduce the repair cost.

In a case of the upper-and-lower electrode type micro-LED 100 shown in FIG. 3B, both the processing of electrically connecting the micro-LED 100 on the uppermost interconnection layer as in Embodiment 1, and the processing of providing the wiring on the micro-LED 100 as in Embodiment 3 are desired. However, as in Embodiment 1, the pixel 2 in which the defect of the backplane substrate 50 is found can be repaired, and also, it is possible to obtain an effect that the problematic micro-LED 100 can be replaced.

Embodiment 4

Embodiment 4 of the present disclosure will be described below. For the convenience of explanation, regarding the member which has the same function as the member demonstrated in the above Embodiment 1, the same reference sign is appended and the description is not repeated.

Figure 11A:
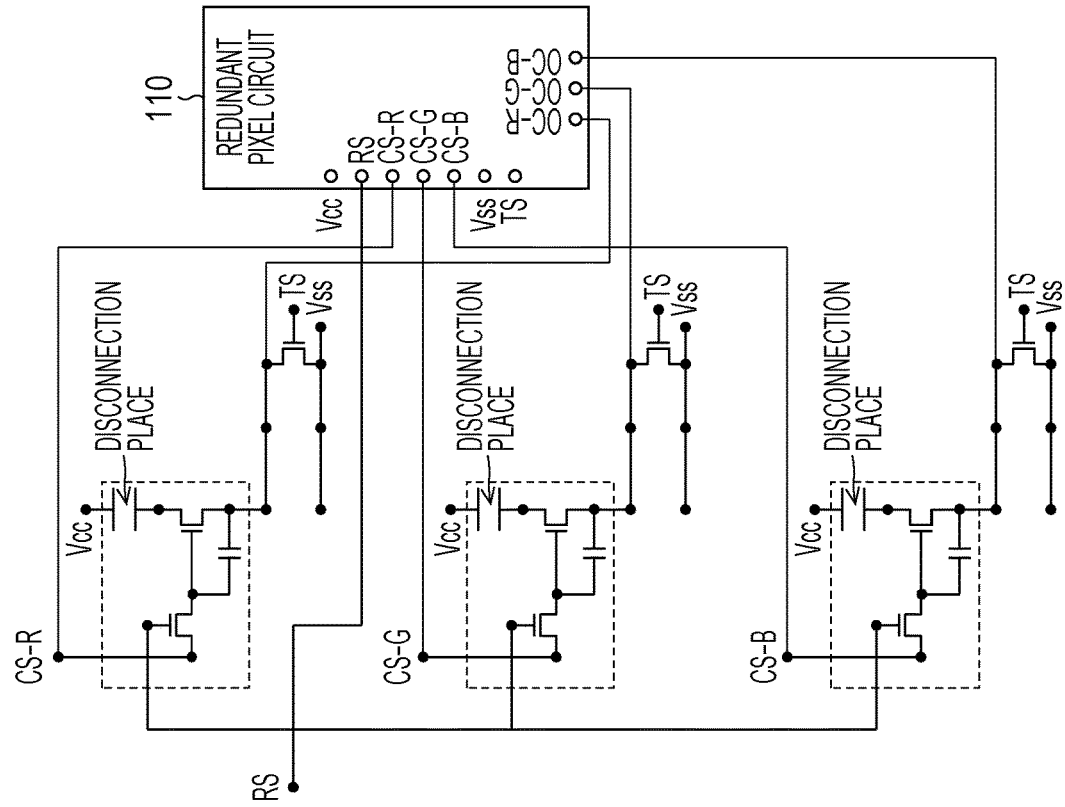
FIG. 11A is an equivalent circuit view of a pixel circuit according to Embodiment 4 of the present disclosure.

FIG. 11A is an equivalent circuit view of a pixel circuit 403 according to Embodiment 4. Since the configuration of the image display device 200 is the same as that of Embodiment 1 except that the pixel circuit 403 does not include the redundant drive circuit RDC at the stage the backplane substrate 50 is manufactured, the description thereof will be omitted. The present embodiment is effective when the area of the pixel 2 is small and there is no margin in the area for disposing the redundant drive circuit RDC in the pixel circuit 403.

As shown in FIG. 11A, the pixel circuit 403 includes the test transistor TTr, but does not include the redundant drive circuit RDC. On the other hand, the pixel circuit 403, when there is a defect in the drive circuit DC, includes a terminal group for attaching a redundant pixel circuit 110 (second LED drive circuit) that substitutes for the drive circuit DC.

The redundant pixel circuit 110 is configured separately from the pixel circuit 403 and provides the same function as the redundant drive circuit RDC to the pixel circuit 403. Although the redundant pixel circuit 110 has a different configuration with the redundant drive circuit RDC in that it is separated from the pixel circuit 403, since the function provided to the pixel circuit 403 is the same, the redundant pixel circuit 110 is also referred to as a second LED drive circuit, similarly to the redundant drive circuit RDC.

Figure 12:
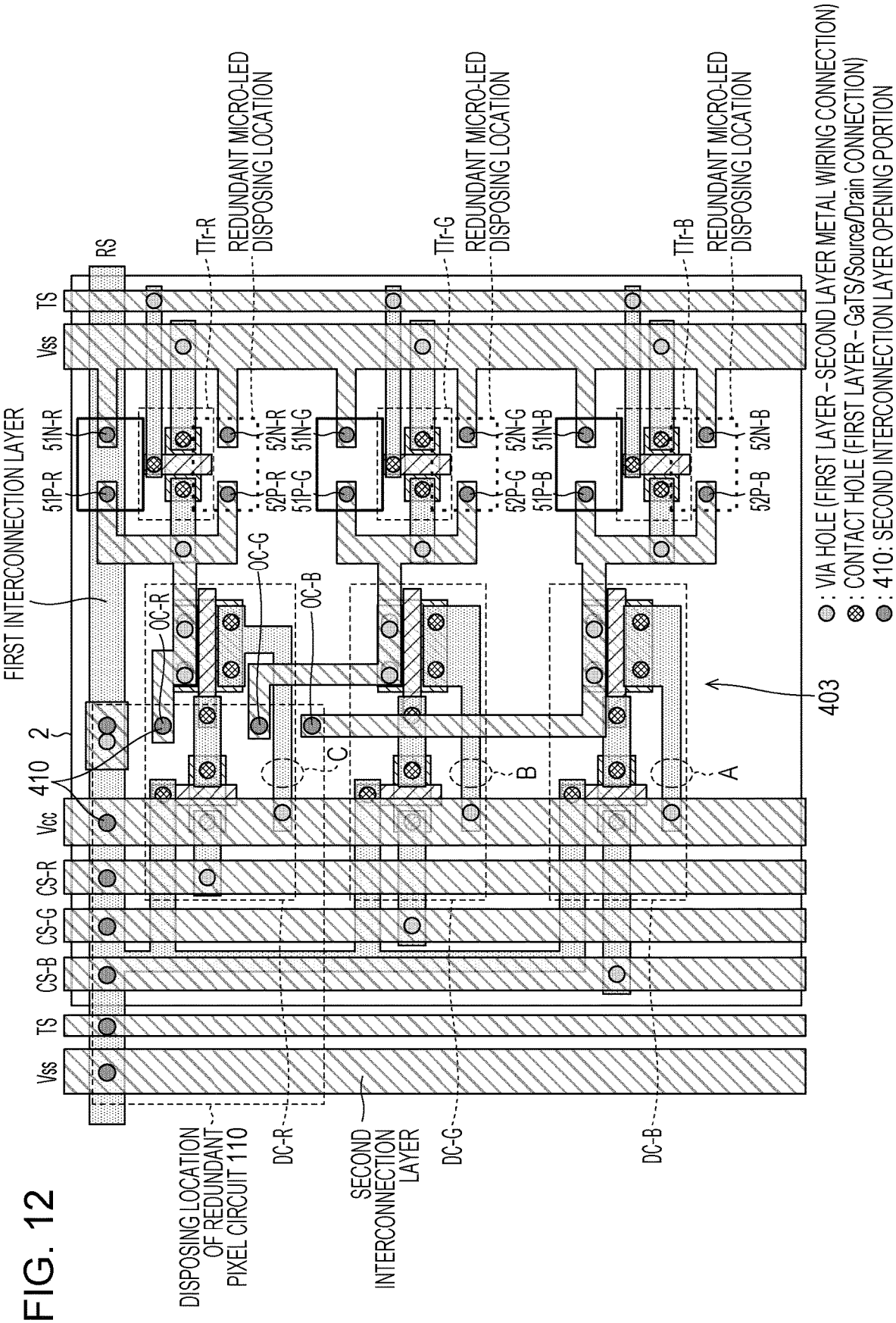
FIG. 12 is a layout view of a pixel of Embodiment 4.

FIG. 12 is a view showing a layout example of the pixel circuit 403. Note that also in FIG. 12, the capacitor of the drive circuit DC is omitted. In a region where the redundant pixel circuit 110 of the pixel circuit 403 is disposed, similar to the connection region for connecting the micro-LED 100, an opening portion 410 in which the protection film 68 on the uppermost interconnection layer (the second interconnection layer in this example) is removed, is provided. As shown in FIG. 12, there is provided an opening portion 410 to which RS, CS-R, CS-G, CS-B, Vcc, Vss, and TS as an input terminal to the redundant pixel circuit 110 and OC-R, OC-G, and OC-B as the current output terminal from the redundant pixel circuit 110 to the micro-LED 100 are connected. It is desirable that the input terminal is directly connected to the corresponding signal line to avoid an increase in wiring resistance. In FIG. 12, other than the RS in which the first interconnection layer is used, the opening portion 410 is provided on the signal line, and the input terminals CS-R, CS-G, CS-B, Vcc, Vss, and TS are directly connected to the corresponding signal lines. RS is connected on the signal lines with the second interconnection layer interposed. Further, OC-R, OC-G, and OC-B are connected to the second interconnection layer (the uppermost interconnection layer) which is directly connected to 51P.

Figure 11B:
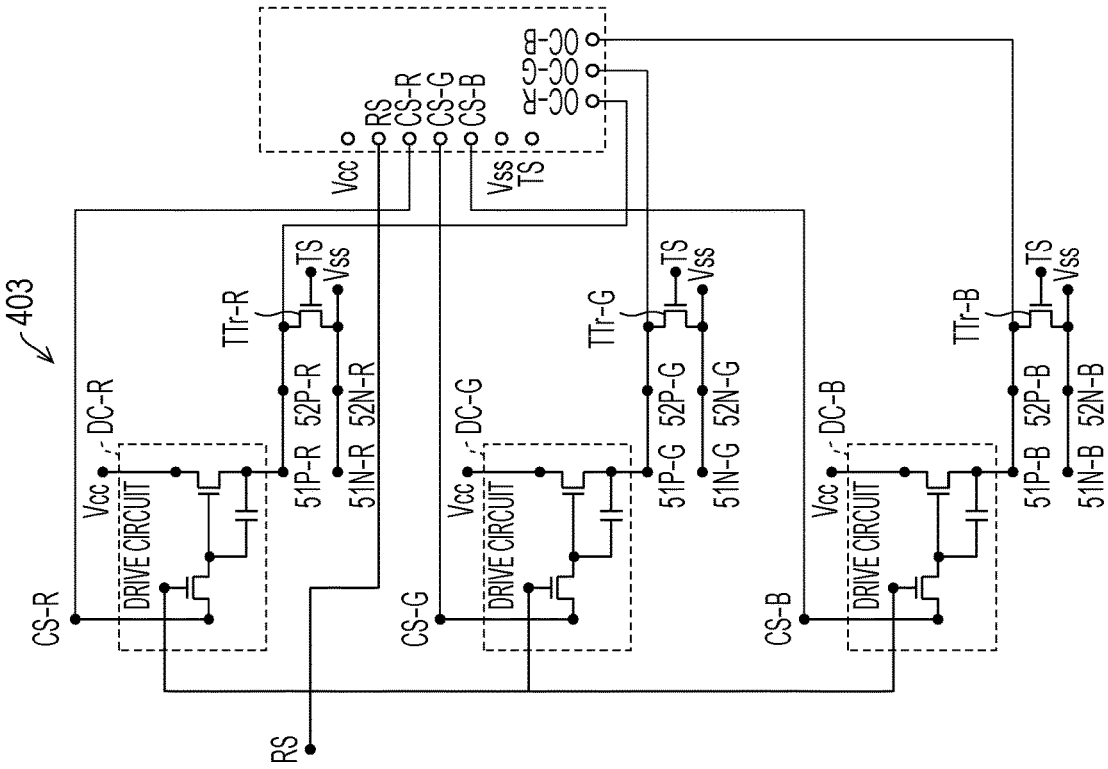
FIG. 11B is an equivalent circuit view of the pixel circuit for explaining repair of a defective drive circuit.

When a defect is found in a specific drive circuit DC in the test processing of the backplane substrate 50 (step S3 in Embodiment 1) and is repaired, as shown in FIG. 11B, the power supply line Vcc of the defective drive circuit DC is disconnected. In the layout example of FIG. 12, first interconnection layers in three places at a place A, a place B, and a place C in the figure, are disconnected.

The redundant pixel circuit 110 is configured with a micro-chip and has the same function as the drive circuit DC. When there is a defect in the drive circuit DC, by attaching the redundant pixel circuit 110 in a micro-chip form to the pixel 2, the electrical connection to the micro-LED 100 can be secured. The same method as in the case of the micro-LED 100 can be used for a method of attaching the redundant pixel circuit 110 to the pixel 2.

Further, by forming the redundant pixel circuit 110 in a micro-chip form on the monocrystalline silicon, a carrier mobility of the silicon crystal can be made much higher than that of the thin film transistor, and the redundant pixel circuit 110 can be manufactured with a small area.

In the examples shown in FIGS. 11A, 11B, and 12, the redundant pixel circuit 110 (second LED drive circuit) includes a function of the drive circuit having respective colors of red, blue and green, and a function of the test transistor. Therefore, even when the test transistor TTr has a defect, the remedy of the pixel circuit 403 by the redundant pixel circuit 110 is possible. However, the redundant pixel circuit 110 may not include the function of the test transistor TTr.

Further, in the examples shown in FIGS. 11A, 11B, and 12, the functions of the pixel circuit 403 are replaced by the redundant pixel circuit 110, and the replacement of the functions by the redundant pixel circuit 110 can also be performed for each subpixel. That is, it is also possible to prepare the redundant pixel circuit 110 that is a substitution for the pixel circuit for each subpixel, and attach the redundant pixel circuit 110 only to the defective subpixel.

Regarding the backplane substrate 50 that is determined to be non-defective when the test of the backplane substrate 50 (step S3 in Embodiment 1) and the repair (step S4 in Embodiment 1) are completed, the processing after the disposing of the micro-LED 100 can be performed in the same manner as in Embodiment 1 shown in FIG. 4.

As described above, in Embodiment 4, since the redundant drive circuit RDC does not have to be formed in advance with the thin film transistors, even when the size of the pixel 2 is small and there is no margin for disposing a spare circuit, it is possible to repair the pixel circuit 403 in which a defect is found. Therefore, according to Embodiment 4 as well, the pixel 2 in which a defect of the backplane substrate 50 is found can be repaired, and also it is possible to obtain the same effect as Embodiment 1 that the problematic micro-LED 100 can be replaced.

Embodiment 5

Embodiment 5 of the present disclosure will be described below. For the convenience of explanation, regarding the member which has the same function as the member demonstrated in the above Embodiment 1 or Embodiment 4, the same reference sign is appended and the description is not repeated.

Figure 13:
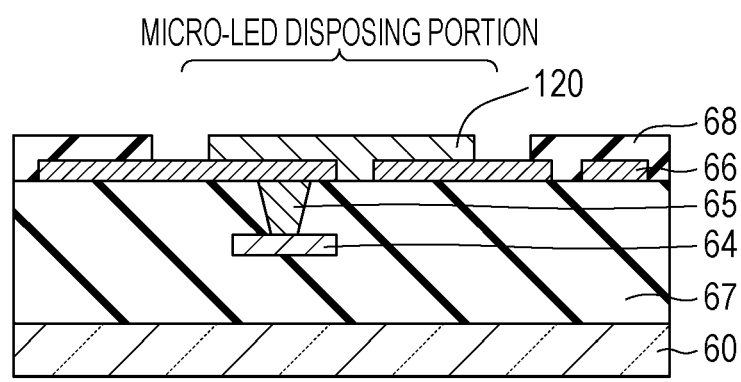
FIG. 13 is a sectional view for explaining a resistance film according to Embodiment 5 of the present disclosure.
Figure 14:
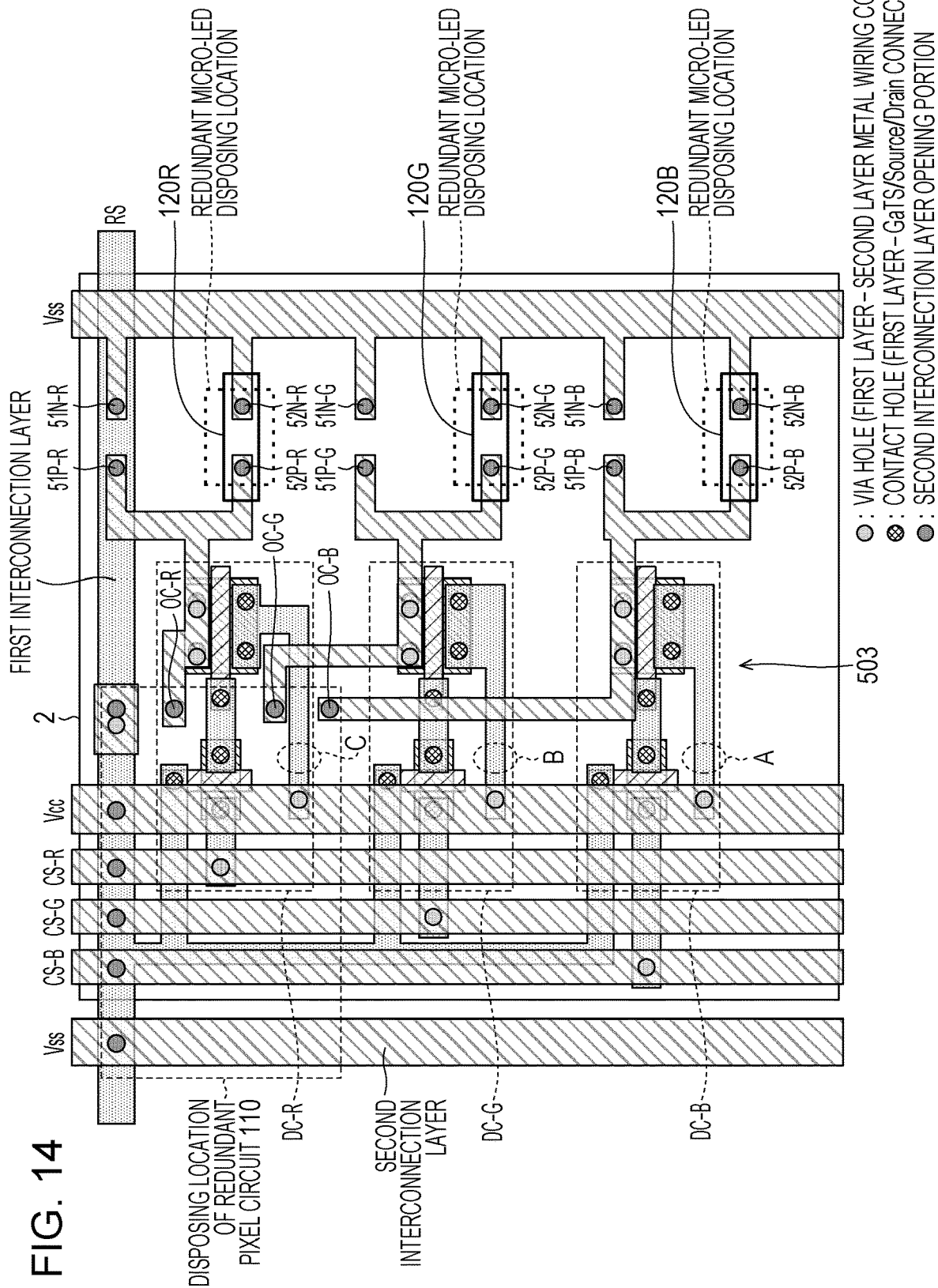
FIG. 14 is a layout view of a pixel of Embodiment 5.

FIG. 13 is a sectional view for explaining a configuration of a resistance film of the pixel 2 of Embodiment 5, and FIG. 14 is a layout view of the pixel 2. The backplane substrate 50 of Embodiment 5 differs from Embodiment 4 in that a pixel circuit 503 does not include the test transistor TTr at the stage that the backplane substrate 50 is manufactured. The other configuration of the image display device 200 is the same as that of Embodiment 1, and thus the description thereof is omitted. A configuration of Embodiment 5 is effective when the area of the pixel 2 is much smaller and there is no margin in the area for disposing the test transistor TTr.

As shown in FIG. 13, in order to substitute a role of the test transistor TTr in the test of the backplane substrate 50 (step S3 in Embodiment 1), a resistance film 120 is formed at the disposing location of the micro-LED 100. The resistance film 120 is deposited so as to connect parts of the uppermost interconnection layers exposed in the micro-LED disposing location, and electrically connects the both wiring lines together. The resistance film 120 is a conduction film formed on the backplane substrate 50 by, for example, a printing method.

The resistance film 120 is formed of, for example, a silver paste material or a silver nanowire ink, and is patterned on the backplane substrate 50 by the printing method or an ink jet printing method. For example, photolithography may be used for patterning the resistance film 120. Further, in order to facilitate conduction between the backplane substrate 50 and the micro-LED 100, it is desirable to form a gold bump on the uppermost interconnection layer exposed to the disposing region of the micro-LED 100.

As shown in FIG. 14, by forming the resistance films 120R, 120G, and 120B at the disposing locations of the micro-LEDs 100, the test of the pixel circuit 503 can be enabled by short-circuiting the installed electrodes of the micro-LEDs 100R, 100G, and 100B. The resistance film 120 is desirably dissolved by a solvent, an aqueous solution or the like and removed after the test of the backplane substrate 50 is finished. As described above, at the stage that the repairing processing of the backplane substrate 50 is finished, the resistance film 120 is removed, and the process proceeds to the processing of disposing the next micro-LED 100 (step S5 in Embodiment 1).

As shown in FIG. 14, it is desirable to set a forming location of the resistance film 120 to one of the disposing locations of the redundant micro-LED 100. Although the frequency is low, the dissolution of the resistance film 120 may be incomplete and may remain. In a case where the resistance film 120 is formed at the disposing location where the micro-LED 100 is disposed initially, when the resistance film 120 remains, it is difficult to remove the residual after the micro-LED 100 is disposed. On the other hand, in a case where the resistance film 120 is formed at a location where the redundant micro-LED 100 is to be disposed, since the micro-LED 100 is not disposed at the stage where the problem of the leakage current occurred, it is possible to remove the residual by performing an additional cleaning or the like.

In Embodiment 5, the method for testing the pixel circuit 503 without providing the test transistor TTr is described. However, other than the test transistor TTr, it is also possible to test the pixel circuit 503 by disposing another switching device between the first terminal 51P and the second terminal 51N. For example, although illustration is omitted, the test may be performed such that a high resistance photoelectric body is disposed between the first terminal 51P and the second terminal 51N, and at the time of testing the pixel circuit 503, a current can be made to flow between the first terminal 51P and the second terminal 51N by providing conductivity with light irradiation.

As described above, according to Embodiment 5, even when there is no margin in the area for disposing the test transistor TTr in the pixel 2, the resistance film 120 can conduct between the disposing electrodes of the micro-LED 100. Thereby, it is possible to test the pixel circuit 503, and by performing the test, it is possible to find out and repair a defect in the pixel circuit 503. Therefore, according to Embodiment 5 as well, the pixel 2 in which a defect of the backplane substrate 50 is found can be repaired, and also it is possible to obtain the same effect as Embodiment 1 that the problematic micro-LED 100 can be replaced.

Embodiment 6

Embodiment 6 of the present disclosure will be described below. For the convenience of explanation, regarding the member which has the same function as the member demonstrated in the above Embodiment 1, 4, or 5, the same reference sign is appended and the description is not repeated.

Figure 15A:
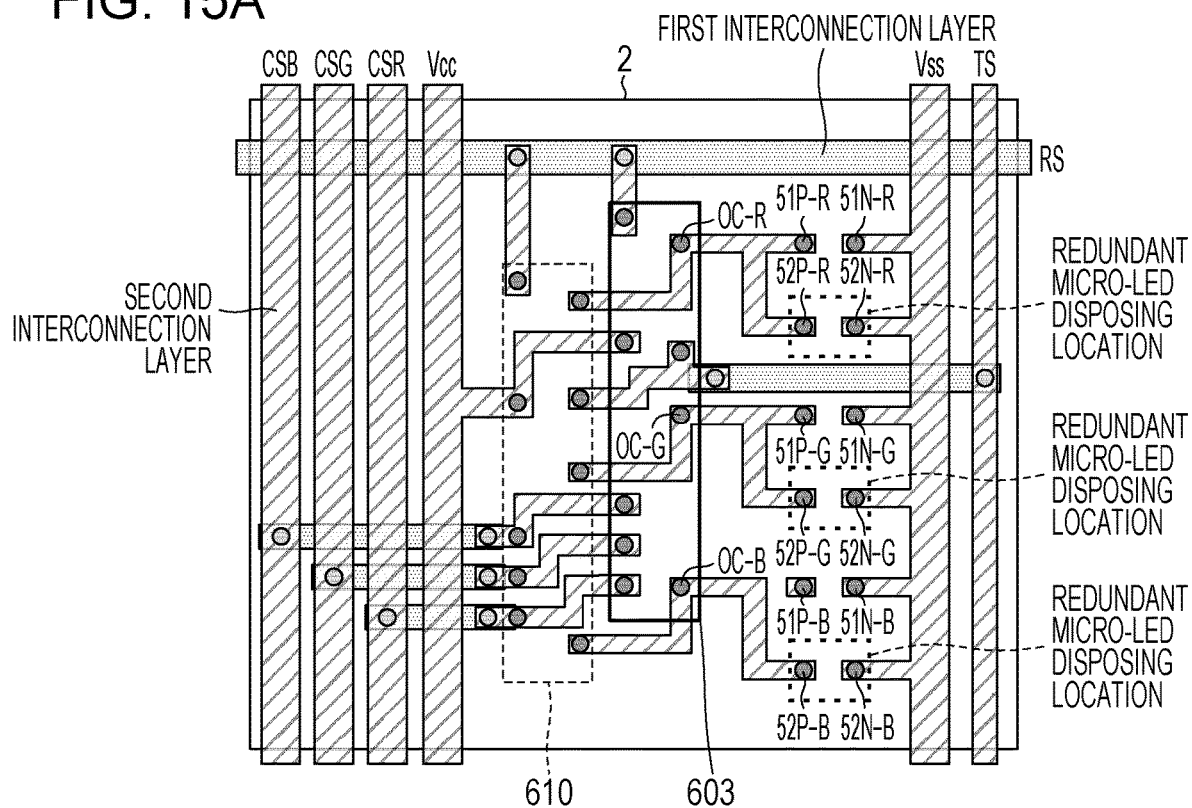
FIG. 15A is a layout view of a pixel before repair according to Embodiment 6.
Figure 15B:
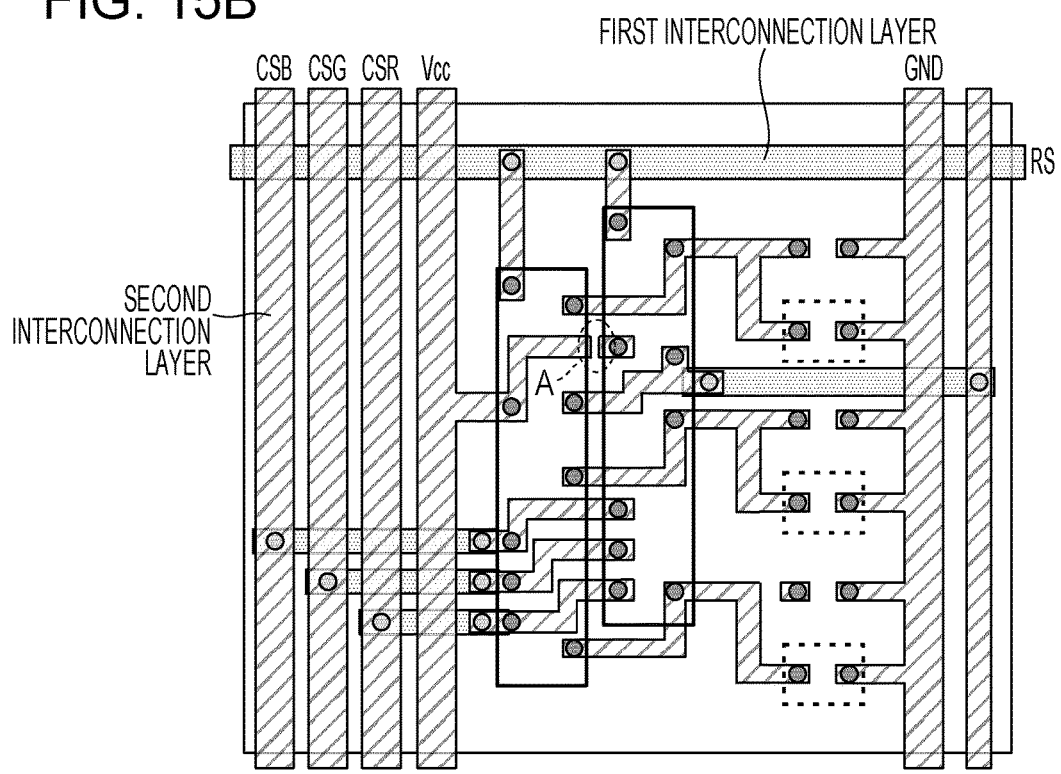
FIG. 15B is a layout view of a pixel after repair according to Embodiment 6.
Figure 16:
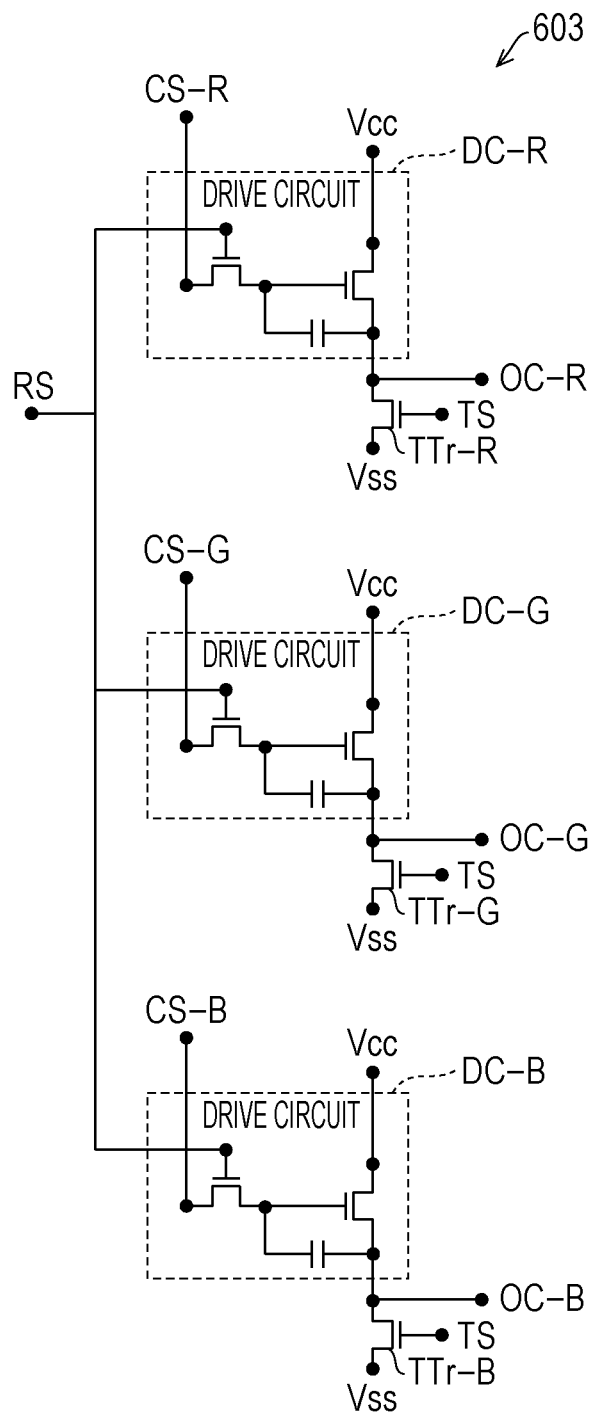
FIG. 16 is an equivalent circuit view of a pixel circuit according to Embodiment 6 of the present disclosure.

FIG. 15A is a layout view of the pixel 2 before the repair according to Embodiment 6, and FIG. 15B is a layout view of the pixel 2 after the repair. FIG. 16 is an equivalent circuit view of a pixel circuit 603. The backplane substrate 50 of Embodiment 6 differs from Embodiment 4 or 5, in that the pixel circuit 603 is configured with a micro-chip and is attached onto the backplane substrate 50 in the same manner as the micro-LED 100. The other configuration of the image display device 200 is the same as that of Embodiment 1, and thus the description thereof is omitted.

Since it is not desired to form a thin film transistor on the backplane substrate 50 in Embodiment 6, it is sufficient to form wiring, and the manufacturing processing can be simplified and the temperature can be lowered. As a result, a film substrate can be easily used for the backplane substrate 50 instead of the glass substrate, and the flexible image display device 200 can be manufactured. Further, by forming the pixel circuit 603 with a monocrystalline silicon, the chip size can be made smaller than that formed with a thin film transistor, and it becomes easy to miniaturize the pixel 2.

As shown in FIG. 15A, in the pixel 2, the pixel circuit 603 in a micro-chip form is disposed on the substrate on which the wiring layer is formed. The disposing processing of the pixel circuit 603 is included in the manufacturing processing of the backplane substrate 50 (step S1 in Embodiment 1). A method of disposing the pixel circuit 603 on the backplane substrate 50 is the same as the method of disposing the micro-LED 100 on the backplane substrate 50.

In addition to each of the subpixels 6, 7, and 8, a plurality of disposing locations of the micro-LED 100 on the backplane substrate 50 are prepared as in the other embodiments. Further, on the backplane substrate 50, wiring and a space for disposing the redundant pixel circuit 603 are prepared in advance at the redundant pixel circuit disposing location 610.

As shown in FIG. 16, the pixel circuit 603 includes the drive circuits DC and the test transistors TTr for the respective subpixels 6, 7, and 8. Therefore, after manufacturing the backplane substrate 50, the test processing (step S3 in Embodiment 1) of the backplane substrate 50 can be performed. When a defect is found in the test of the backplane substrate 50, as shown in FIG. 15B, another pixel circuit 603 is disposed at a redundant pixel circuit disposing location 610 in the repairing processing (step S4 in Embodiment 1). Furthermore, as shown at a place A in FIG. 15B, it is desirable that the power supply line of the defective pixel circuit 603 disposed initially, is disconnected in the repairing processing. As shown in FIG. 15A, it is desirable that the output terminals OC-R, OC-G, and OC-B of the pixel circuit 603 are directly connected to the second interconnection layer (the uppermost interconnection layer) which constitutes the 51P. Thus an increase in resistance can be avoided. The same applies to the redundant pixel circuit.

As described above, in the image display device 200 of Embodiment 6, a plurality of pixels 2 including the micro-LED 100 are disposed on the backplane substrate 50 having a plurality of pixel circuits 603 for supplying a current to the micro-LED 100. At least two sets of a pair of wiring lines (one set with the first terminal 51P and the second terminal 51N, and one set with the first terminal 52P and the second terminal 52N), that is connected to a pair of electrodes 30 and 31 of the micro-LED 100 and is coupled to the pixel circuit 603, are disposed on the pixel 2. The pixel circuit 603 includes a micro-chip having the drive circuit DC for supplying a current to the micro-LED 100, and the test transistor TTr configured with a switching device for short-circuiting the pair of wiring lines, and also has wiring for disposing at least two sets of micro-chips.

In the layout example of the pixel 2 shown in FIG. 15A, the plurality of pixel circuits 603 are disposed in series to connect with the micro-LED 100, but the present embodiment is not limited to this, and it is also possible to dispose the plurality of pixel circuits 603 in parallel to connect with the micro-LED 100. Further, the example shown in FIGS. 15 and 16 shows a case where circuits for one pixel are included in the pixel circuit 603 in a micro-chip form, but the present embodiment is not limited to this, and one pixel circuit 603 in a micro-chip form may include circuits for a plurality of pixels as long as a disposition of wiring lines allows. In this case, the transfer quantity of the pixel circuit 603 can be reduced, and the cost can be reduced.

Therefore, according to Embodiment 6 as well, the pixel 2 in which a defect of the backplane substrate 50 is found can be repaired, and also it is possible to obtain the same effect as Embodiment 1 that the problematic micro-LED 100 can be replaced. Furthermore, the advantages where the pixel 2 can be easily miniaturized and the flexible image display device 200 can be manufactured, can be realized.

The present disclosure is not limited to the above-described embodiments, and various modifications can be made within the scope of the claims, and embodiments obtained by appropriately combining the technical methods disclosed in different embodiments are also included in the technical scope of the present disclosure. Furthermore, new technical features can be formed by combining the technical methods disclosed in each embodiment.

The present disclosure contains subject matter related to that disclosed in Japanese Priority Patent Application JP 62/717305 filed in the Japan Patent Office on Aug. 10, 2018, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An image display device, comprising:
an array of pixels, each pixel has at least one micro-LED;
a backplane substrate having an array of pixel circuits corresponding to the pixels, each pixel circuit comprising:
a set of signal lines;
a power supply line and a ground line;
a first LED drive circuit;
a second LED drive circuit;
a plurality of pairs of a first terminal and a second terminal;
wiring lines which connect the first LED drive circuit with the first terminals; and
a switching device which electrically connects the first terminals with the second terminals,
wherein each of the micro-LEDs has a pair of electrodes that are connected with one of the pairs of the first terminal and the second terminal.

2. The image display device of claim 1,
wherein the pair of micro-LED electrodes is disposed on a surface of each micro-LED facing to the backplane substrate and each micro-LED emits light to a direction opposite to the backplane substrate.

3. The image display device of claim 1,
wherein each of the pixels has a plurality of subpixels, each subpixel has at least one micro-LED and the pixel circuit independently.

4. The image display device of claim 1,
wherein each of the pixels has a plurality of subpixels, each subpixel has at least one micro-LED and each pixel circuit independently without the second LED drive circuit and each pixel has the second LED drive circuit.

5. The image display device of claim 1,
wherein the second LED drive circuit contains a thin film transistor disposed on the backplane substrate.

6. The image display device of claim 1,
wherein the second LED drive circuit comprises a micro-chip.

7. The image display device of claim 1,
wherein a test signal line is disposed on the backplane substrate to control the switching device to turn-on and turn-off.

8. The image display device of claim 1,
wherein the wiring lines, the first terminals and the second terminals are made of the uppermost interconnection layer of the backplane substrate.

9. The image display device of claim 8,
wherein the uppermost interconnection layer of the backplane substrate is covered with a protection film and the first terminal and the second terminal are made of the uppermost interconnection layer but not covered with the protection layer.

10. The image display device of claim 9,
wherein the protection film is disposed between pairs of the first terminal and the second terminal.

11. The image display device of claim 8,
wherein the uppermost interconnection layer of the backplane substrate is covered with a protection film, connection holes are opened on the first terminals and the second terminals, and the pair of electrodes are connected with the first terminal and the second terminal through the connection holes with connection electrodes interposed between the pair of electrodes and the first terminal and the second terminal.

12. The image display device of claim 11,
wherein the connection electrodes cover the connection holes on a pair of the first terminal and the second terminal, which are not connected with the pair of electrodes.

13. The image display device of claim 6,
wherein the set of signal lines, the power supply line and the ground line are made of the uppermost interconnection layer of the backplane substrate except one signal line.

14. The image display device of claim 6,
wherein an output terminal of the micro-chip is connected directly to corresponding wiring.

15. The image display device of claim 6,
wherein an input terminal of the micro-chip is connected directly to a corresponding signal line on the backplane substrate.

16. An image display device, comprising:
an array of pixels, each pixel has at least one micro-LED;
a backplane substrate having an array of pixel circuits corresponding to the pixels, each pixel circuit comprising:
a set of signal lines;
a power supply line and a ground line;
a plurality of pairs of a first terminal and a second terminal;
a micro-chip comprising:
a first LED drive circuit;
a switching device which electrically connects the first terminals with the second terminals; and
wiring lines which connect the micro-chip with the first terminals,
wherein each of the micro-LEDs has a pair of electrodes that are connected with one of the pairs of the first terminal and the second terminal, and the pixel circuit has a space where an extra micro-chip is disposable and the wiring lines extend to the space.

17. The image display device of claim 16,
wherein a test signal line is disposed on the backplane substrate to control the switching device to turn-on and turn-off.

18. The image display device of claim 16,
wherein an output terminal of the micro-chip is connected directly to corresponding wiring.

19. An image display device, comprising:
an array of pixels, each pixel has at least one micro-LED;
a backplane substrate having an array of pixel circuits corresponding to the pixels, each pixel circuit comprising:
a set of signal lines;
a power supply line and a ground line;
a first LED drive circuit;
a plurality of pairs of a first terminal and a second terminal;
wiring lines which connect the first LED drive circuit with the first terminals; and
a switching device which electrically connects the first terminals with the second terminals,
wherein each of the micro-LEDs has a pair of electrodes that are connected with one of the pairs of the first terminal and the second terminal and the switching device contains a thin film transistor disposed on the backplane substrate.

20. The image display device of claim 19,
wherein a test signal line is disposed on the backplane substrate to control the switching device to turn-on and turn-off.

* * * * *